(12) United States Patent
Qing

(10) Patent No.: US 11,908,414 B2
(45) Date of Patent: *Feb. 20, 2024

(54) DISPLAY APPARATUS WITH COMPENSATION AND DRIVING METHOD THEREFOR

(71) Applicants: Chengdu BOE Optoelectronics Technology Co., Ltd., Chengdu (CN); BOE Technology Group Co., Ltd., Beijing (CN)

(72) Inventor: Haigang Qing, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/771,499

(22) PCT Filed: Jun. 9, 2021

(86) PCT No.: PCT/CN2021/099187
§ 371 (c)(1),
(2) Date: Apr. 25, 2022

(87) PCT Pub. No.: WO2022/017044
PCT Pub. Date: Jan. 27, 2022

(65) Prior Publication Data
US 2022/0415259 A1 Dec. 29, 2022

(30) Foreign Application Priority Data
Jul. 21, 2020 (CN) .......................... 202010707046.2

(51) Int. Cl.
*G09G 3/3258* (2016.01)
*G09G 3/3233* (2016.01)

(52) U.S. Cl.
CPC ......... *G09G 3/3258* (2013.01); *G09G 3/3233* (2013.01); *G09G 2300/0426* (2013.01);
(Continued)

(58) Field of Classification Search
CPC ........... G09G 3/3258; G09G 2310/061; G09G 2300/0842; G09G 2300/0426; G09G 2310/0278; G09G 2320/0233
See application file for complete search history.

(56) References Cited

U.S. PATENT DOCUMENTS 6,580,657 B2 * 6/2003 Sanford ................ G11C 11/419
257/82
2014/0111563 A1 4/2014 Hwang et al.
(Continued)

FOREIGN PATENT DOCUMENTS

CN 105489167 A 4/2016
CN 106935198 A 7/2017
(Continued)

OTHER PUBLICATIONS

International Search Report for PCT/CN2021/099187 dated Aug. 27, 2021.
(Continued)

*Primary Examiner* — Kwang-Su Yang
(74) *Attorney, Agent, or Firm* — Ling Wu; Stephen Yang; Ling and Yang Intellectual Property

(57) ABSTRACT

A display apparatus and driving method therefor. The apparatus comprises light emitting element, pixel circuit, scan signal line, data signal line, initial signal line, light emission control line, first power source line, and first reset line to third reset line. The pixel circuit comprises: first reset sub-circuit configured to provide a signal of the initial signal line to a first node; node control sub-circuit configured to provide a signal of the data signal line to a second node, (Continued)

compensate for the first node until a voltage thereof satisfies a threshold condition, provide a signal of the second node to the third node; light emission control sub-circuit configured to provide a signal of the first power source line to the second node and a signal of the third node to light emitting element; second reset sub-circuit configured to provide a signal of the initial signal line to light emitting element.

22 Claims, 22 Drawing Sheets

(52) U.S. Cl.
CPC ............... *G09G 2300/0819* (2013.01); *G09G 2300/0842* (2013.01); *G09G 2300/0861* (2013.01); *G09G 2310/0278* (2013.01); *G09G 2310/061* (2013.01); *G09G 2310/08* (2013.01); *G09G 2320/0233* (2013.01); *G09G 2320/045* (2013.01)

(56) References Cited

U.S. PATENT DOCUMENTS

| | | | |
|---|---|---|---|
| 2014/0354517 | A1 | 12/2014 | Chung et al. |
| 2016/0225318 | A1* | 8/2016 | Choi .................. G09G 3/3258 |
| 2019/0073955 | A1* | 3/2019 | Zou ..................... G09G 3/3258 |
| 2019/0095016 | A1 | 3/2019 | Yang et al. |
| 2019/0096327 | A1 | 3/2019 | Peng et al. |
| 2019/0147798 | A1 | 5/2019 | Hwang et al. |
| 2020/0234633 | A1 | 7/2020 | Wang et al. |
| 2020/0320937 | A1* | 10/2020 | Yang ................... G09G 3/3258 |
| 2021/0312861 | A1 | 10/2021 | Wang et al. |
| 2022/0157238 | A1* | 5/2022 | Wang .................. G09G 3/3233 |

FOREIGN PATENT DOCUMENTS

| | | |
|---|---|---|
| CN | 107564474 A | 1/2018 |
| CN | 107610652 A | 1/2018 |
| CN | 109712565 A | 5/2019 |
| CN | 109979394 A | 7/2019 |
| CN | 111243526 A | 6/2020 |
| CN | 111354315 A | 6/2020 |
| CN | 111951731 A | 11/2020 |
| CN | 111968581 A | 11/2020 |
| CN | 112037714 A | 12/2020 |

OTHER PUBLICATIONS

Office Action dated Jun. 27, 2022 for Chinese Patent Application No. 202010707046.2 and English Translation.

* cited by examiner

DISPLAY APPARATUS WITH COMPENSATION AND DRIVING METHOD THEREFOR

CROSS-REFERENCE TO RELATED APPLICATIONS

The present application is a U.S. National Phase Entry of International Application No. PCT/CN2021/099187 having an international filing date of Jun. 9, 2021, which claims priority to Chinese Patent Application No. 202010707046.2 filed to the CNIPA on Jul. 21, 2020. The above-identified applications are incorporated into this application by reference in their entireties.

TECHNICAL FIELD

The present disclosure relates, but is not limited, to the field of display technology, and in particular, to a display apparatus and a driving method therefor.

BACKGROUND

An Organic Light Emitting Diode (OLED for short) is now one of hotspots in the research field of display. Compared with Liquid Crystal Display (LCD for short), the OLED has the advantages such as low energy consumption, low production cost, self-illumination, wide viewing angle and fast response speed, and has been widely used in the field of display such as mobile phones, tablet computers and digital cameras.

Unlike the LCD which uses stable voltage to control luminance, the OLED adopts a current drive way, and controls light emission of the OLED by the stable current. As the core technology of OLED display products, a pixel circuit is configured to output a drive current to OLED to drive the OLED to emit light.

SUMMARY

The following is a summary for subject matters described herein in detail. The summary is not intended to limit the scope of protection of claims.

In a first aspect, the present disclosure provides a display apparatus including: light emitting elements arranged in a matrix, pixel circuits arranged in a matrix, a scan signal line, a data signal line, an initial signal line, a light emitting control line, a first power supply line, a first reset line, a second reset line, and a third reset line.

The pixel circuits correspond to the light emitting elements in a one-to-one way. Each of the pixel circuits is configured to drive a corresponding light emitting element to emit light. The pixel circuit includes a first reset sub-circuit, a node control sub-circuit, a light emitting control sub-circuit and a second reset sub-circuit.

The first reset sub-circuit is connected with the first reset line, the scan signal line, the initial signal line and a first node, respectively, and configured to provide a signal of the initial signal line for the first node under control of the first reset line and the scan signal line.

The node control sub-circuit is connected with the scan signal line, the second reset line, the data signal line, the first node, a second node, a third node and a first power supply line, respectively, and configured to provide a signal of the data signal line for the second node under control of the scan signal line, the second reset line and the first node, and compensate for the first node through the second node and the third node until a voltage of the first node satisfies a threshold condition; and provide a signal of the second node for the third node under control of the first node.

The light emitting control sub-circuit is connected with the light emitting control line, the first power supply line, the second node, the third node and the light emitting element, respectively, and configured to provide a signal of the first power supply line for the second node and a signal of the third node for the light emitting element under control of the light emitting control line.

The second reset sub-circuit is connected with the third reset line, the initial signal line and the light emitting element, respectively, and configured to provide a signal of the initial signal line for the light emitting element under control of the third reset line.

The third reset line connected with pixel circuits located in an ith row is electrically connected with the first reset line connected with pixel circuits located in an (i+1)th row, $1 \leq i < M$, and M is a total number of rows of the pixel circuits.

In some possible implementations, the display apparatus includes: a base, and a drive structure layer and a light emitting structure layer that are sequentially arranged on the base.

The drive structure layer includes the pixel circuit, the scan signal line, the data signal line, the initial signal line, the light emitting control line, the first power supply line, the first reset line, the second reset line and the third reset line, and the light emitting structure layer includes the light emitting element.

The scan signal line, the initial signal line, the light emitting control line, the first reset line, the second reset line, and the third reset line extend in a first direction, and the data signal line and the first power supply line extend in a second direction; the first direction intersects with the second direction.

In some possible implementations, each pixel circuit includes: a storage capacitor including a first plate and a second plate; the first plate is connected with the first power supply line, and the second plate is connected with the first node.

An orthographic projection of the first plate on the base partially overlaps an orthographic projection of the second plate on the base; the first plate is provided with a via, and the via of the first plate exposes the second plate.

The scan signal line, the first reset line and the second reset line are located on a side of the second plate, and the light emitting control line and the third reset line are located on a side of the second plate away from the first reset line.

The first reset line is located on a side of the scan signal line away from the second plate, and the second reset line is located on a side of the scan signal line close to the second plate; the third reset line is located on a side of the light emitting control line away from the second plate.

The initial signal line includes a first initial signal line and a second initial signal line; the first initial signal line and the first reset line are located on the same side of the second plate, and the first initial signal line is located on a side of the first reset line away from the second plate; the second initial signal line and the third reset line are located on the same side of the second plate, and the second initial signal line is located on a side of the third reset line away from the second plate.

In some possible implementations, the drive structure layer further includes: a power supply connection line and a connection electrode; the power supply connection line is arranged in a different layer from a layer in which the first power supply line is arranged, and is connected with the first power supply line, and the first plate is connected with the first power supply line through the power supply connection line; an orthographic projection of the power supply connection line on the base at least partially overlaps an orthographic projection of the first plate on the base, and at least partially overlaps an orthographic projection of the first power supply line on the base; and the connection electrode is configured to connect the pixel circuit and the light emitting element.

In some possible implementations, the node control sub-circuit includes: a write sub-circuit, a drive sub-circuit, a compensation sub-circuit, and an energy storage sub-circuit.

The write sub-circuit is connected with the scan signal line, the second reset line, the data signal line and the second node, respectively, and configured to provide a signal of the data signal line for the second node or discharge to the second node under the control of the scan signal line and the second reset line.

The drive sub-circuit is connected with the first node, the second node, and the third node, and configured to provide a signal of the second node for the third node under control of the first node.

The compensation sub-circuit is connected with the first node, the second reset line and the third node, respectively, and configured to provide a potential of the third node for the first node under the control of the second reset line to compensate for the first node until a voltage of the first node satisfies a threshold condition.

The energy storage sub-circuit is connected with the first power supply line and the first node, respectively, and configured to store a voltage difference between the first power supply line and the first node.

In some possible implementations, the first reset sub-circuit includes a first transistor and a second transistor; a control electrode of the first transistor is connected with the first reset line, a first electrode of the first transistor is connected with the initial signal line, and a second electrode of the first transistor is connected with a first electrode of the second transistor; a control electrode of the second transistor is connected with a scan signal line, and a second electrode of the second transistor is connected with the first node.

In some possible implementations, the write sub-circuit includes a third transistor and a fourth transistor; a control electrode of the third transistor is connected with the scan signal line, a first electrode of the third transistor is connected with the data signal line, and a second electrode of the third transistor is connected with a first electrode of the fourth transistor; a control electrode of the fourth transistor is connected with the second reset line, and a second electrode of the fourth transistor is connected with the second node; a length of a channel region of the fourth transistor is greater than a threshold length, and a width of the channel region of the fourth transistor is greater than a threshold width.

In some possible implementations, the drive sub-circuit includes: a fifth transistor, and the fifth transistor is a drive transistor; the energy storage sub-circuit includes: a storage capacitor; a control electrode of the fifth transistor is connected with the first node, a first electrode of the fifth transistor is connected with the second node, and a second electrode of the fifth transistor is connected with the third node; a first end of the storage capacitor is connected with the first power supply line, and a second end of the storage capacitor is connected with the first node.

In some possible implementations, the compensation sub-circuit includes: a sixth transistor; a control electrode of the sixth transistor is connected with the second reset line, a first electrode of the sixth transistor is connected with the first node, and a second electrode of the sixth transistor is connected with the third node.

In some possible implementations, the light emitting control sub-circuit includes a seventh transistor and an eighth transistor; a control electrode of the seventh transistor is connected with the light emitting control line, a first electrode of the seventh transistor is connected with the first power supply line, and a second electrode of the seventh transistor is connected with the second node; a control electrode of the eighth transistor is connected with the light emitting control line, a first electrode of the eighth transistor is connected with the third node, and a second electrode of the eighth transistor is connected with the light emitting element.

In some possible implementations, the second reset sub-circuit includes a ninth transistor; a control electrode of the ninth transistor is connected with the third reset line, a first electrode of the ninth transistor is connected with the initial signal line, and a second electrode of the ninth transistor is connected with the light emitting element.

In some possible implementations, the first reset sub-circuit includes: a first transistor and a second transistor; the node control sub-circuit includes a third transistor, a fourth transistor, a fifth transistor, a sixth transistor and a storage capacitor, and the fifth transistor is a drive transistor; the light emitting control sub-circuit includes a seventh transistor and an eighth transistor; the second reset sub-circuit includes a ninth transistor.

A control electrode of the first transistor is connected with the first reset line, a first electrode of the first transistor is connected with the initial signal line, and a second electrode of the first transistor is connected with a first electrode of the second transistor.

A control electrode of the second transistor is connected with a scan signal line, and a second electrode of the second transistor is connected with the first node.

A control electrode of the third transistor is connected with the scan signal line, a first electrode of the third transistor is connected with the data signal line, and a second electrode of the third transistor is connected with the a first electrode of the fourth transistor.

A control electrode of the fourth transistor is connected with the second reset line, and a second electrode of the fourth transistor is connected with the second node.

A control electrode of the fifth transistor is connected with the first node, a first electrode of the fifth transistor is connected with the second node, and a second electrode of the fifth transistor is connected with the third node.

A control electrode of the sixth transistor is connected with the second reset line, a first electrode of the sixth transistor is connected with the first node, and a second electrode of the sixth transistor is connected with the third node.

A first end of the storage capacitor is connected with the first power supply line, and a second end of the storage capacitor is connected with the first node.

A control electrode of the seventh transistor is connected with the light emitting control line, a first electrode of the seventh transistor is connected with the first power supply line, and a second electrode of the seventh transistor is connected with the second node.

A control electrode of the eighth transistor is connected with the light emitting control line, a first electrode of the eighth transistor is connected with the third node, and a second electrode of the eighth transistor is connected with the light emitting element.

A control electrode of the ninth transistor is connected with the third reset line, a first electrode of the ninth transistor is connected with the initial signal line, and a second electrode of the ninth transistor is connected with the light emitting element.

In some possible implementations, the light emitting element includes: an organic light emitting diode; an anode of the organic light emitting diode is connected with a second electrode of an eighth transistor and a second electrode of a ninth transistor, respectively, and a cathode of the organic light emitting diode is connected with a second power supply line.

In some possible implementations, the threshold condition is that a voltage of the first node is equal to a difference between a voltage of the signal of the data signal line and an absolute value of a threshold voltage of the fifth transistor.

In some possible implementations, the scan signal line and the third reset line are electrically connected.

In some possible implementations, each transistor of the first transistor to the ninth transistor includes: an active layer, a control electrode, a first electrode, and a second electrode.

A drive structure layer includes: an active layer, a first insulation layer, a first metal layer, a second insulation layer, a second metal layer, a third insulation layer, a third metal layer, a fourth insulation layer, a first planarization layer, a fourth metal layer, and a second planarization layer that are sequentially arranged in a direction perpendicular to the base.

The active layer includes the initial signal line and active layers of all transistors; the first metal layer includes the scan signal line, the first reset line, the second reset line, the second plate, the light emitting control line, the third reset line and control electrodes of all transistors; the second metal layer includes: the first plate; the third metal layer includes the power supply connection line and first electrodes or second electrodes of a part of the transistors; the fourth metal layer includes the first power supply line, the data signal line and the pixel electrode.

In some possible implementations, the control electrode of the first transistor, the control electrode of the second transistor, the control electrode of the third transistor, the control electrode of the fourth transistor and the control electrode of the sixth transistor are located on a first side of the second plate, the control electrode of the seventh transistor, the control electrode of the eighth transistor and the control electrode of the ninth transistor are located on a second side of the second plate, and the first side and the second side are arranged oppositely to each other.

The control electrode of the second transistor is located on a side of the control electrode of the first transistor close to the second plate; the control electrode of the second transistor and the control electrode of the third transistor are an integrated structure; the control electrode of the fourth transistor is located on a side of the control electrode of the second transistor close to the second plate; the control electrode of the fourth transistor and the control electrode of the sixth transistor are an integrated structure; the second plate and the control electrode of the fifth transistor are an integrated structure; the control electrode of the seventh transistor and the control electrode of the eighth transistor are an integrated structure, and the control electrode of the ninth transistor is located on a side of the control electrode of the seventh transistor away from the second plate.

In some possible implementations, the first insulation layer, the second insulation layer, and the third insulation layer are provided with a first via, a second via, a third via, and a fourth via; the second insulation layer and the third insulation layer are provided with a fifth via; the third insulation layer is provided with a sixth via; the fourth insulation layer and the first planarization layer are provided with a seventh via, an eighth via and a ninth via; the second planarization layer includes a tenth via.

The first via exposes the active layer of the third transistor, and the first electrode of the third transistor is connected with the active layer of the third transistor through the first via. The second via exposes the active layer of the second transistor, and the second electrode of the second transistor is connected with the active layer of the second transistor through the second via. The third via exposes the active layer of the eighth transistor, and the second electrode of the eighth transistor is connected with the active layer of the eighth transistor through the third via. The fourth via exposes the active layer of the seventh transistor, and the first electrode of the seventh transistor is connected with the active layer of the seventh transistor through the fourth via. The fifth via exposes the second plate, and the second electrode of the second transistor is connected with the second plate through the fifth via. The sixth via exposes the first plate, and the power supply connection line is connected with the first plate through the sixth via. The seventh via exposes the first electrode of the third transistor, and the data signal line is connected with the first electrode of the third transistor through the seventh via. The eighth via exposes the power supply connection line, and the first power supply line is connected with the power supply connection line through the eighth via. The ninth via exposes the second electrode of the eighth transistor, and the connection electrode is connected with the second electrode of the eighth transistor through the ninth via. The tenth via exposes the connection electrode, and the light emitting element is connected with the connection electrode through the tenth via.

In some possible implementations, the light emitting element includes: a first electrode, a second electrode, and an organic light emitting layer; the first electrode is located on a side of the organic light emitting layer close to the base, and the second electrode is located on a side of the organic light emitting layer away from the base; a light emitting structure layer includes a pixel define layer, a transparent conductive layer, an organic material layer and a conductive layer, the transparent conductive layer includes a first electrode, and the organic material layer includes an organic light emitting layer; the conductive layer includes a second electrode.

In a second aspect, the present disclosure provides a method for driving a display apparatus, and the method is configured to drive the above display apparatus. The method includes: providing, by a first reset sub-circuit, a signal of an initial signal line for a first node under the control of a first reset line and a scan signal line; providing, by a second reset sub-circuit, a signal of the initial signal line for a light emitting element under the control of a third reset line, and providing, by a node control sub-circuit, a signal of a data signal line for a second node under the control of the scan signal line, the second reset line and the first node, and compensating for the first node through a second node and a third node until a voltage of the first node satisfies a threshold condition; providing, by a light emitting control sub-circuit, a signal of a first power supply line for the second node and a signal of the third node for the light emitting element under the control of the light emitting control line; providing, by the node control sub-circuit, a signal of the second node for the third nod under the control of the first node.

After the accompanying drawings and the detailed description are read and understood, other aspects can be understood.

BRIEF DESCRIPTION OF DRAWINGS

Accompanying drawings are used for providing an understanding of technical solutions of the present disclosure and form a part of the specification, are used for explaining the technical solutions of the present disclosure together with embodiments of the present disclosure, and do not constitute a limitation on the technical solutions of the present disclosure.

DETAILED DESCRIPTION

Figure 1:
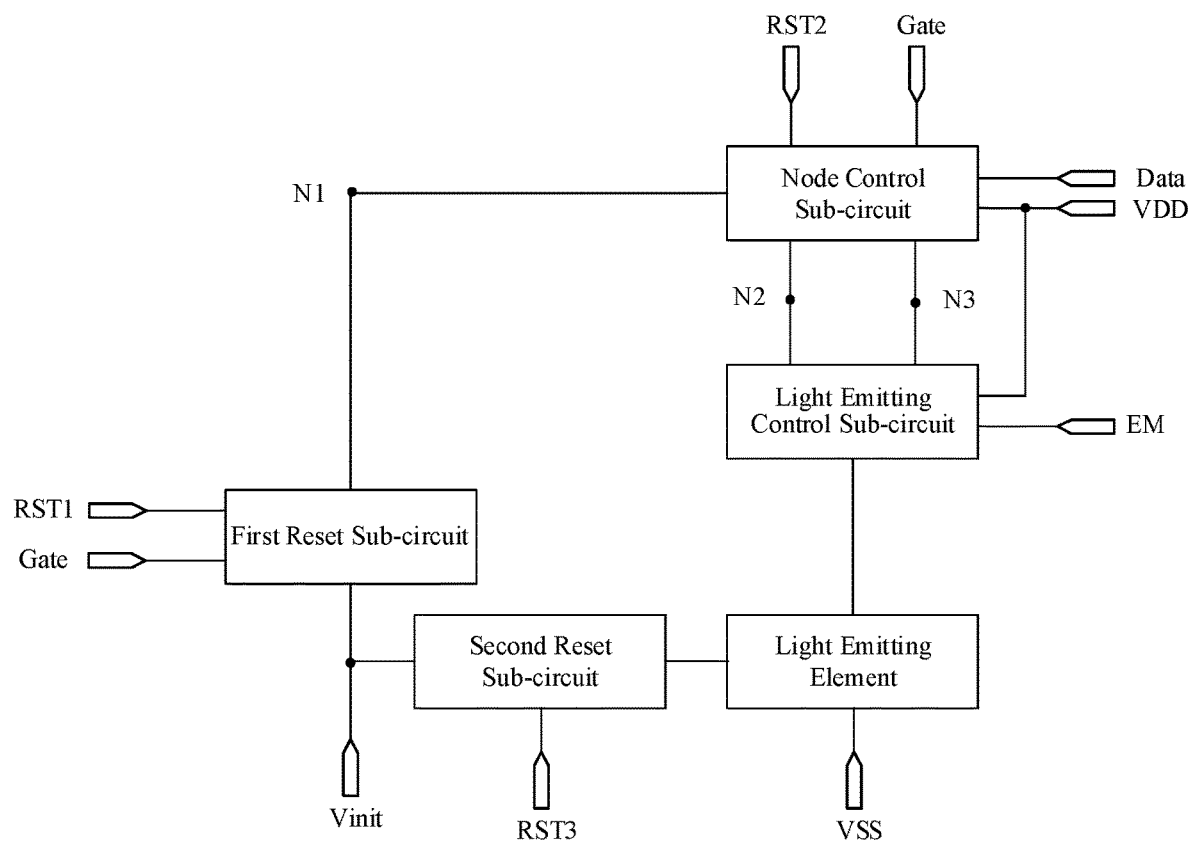
FIG. 1 is a schematic diagram of structure of a pixel circuit according to an embodiment of the present disclosure.

Multiple embodiments are described in the present disclosure, but the description is exemplary rather than limiting. For a person of ordinary skill in the art, there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and conceives of combinations of the features and elements known to a person of ordinary skill in the art. The embodiments, features, and elements that have been disclosed in the present disclosure may also be combined with any of conventional features or elements to form technical solutions defined by the claims. Any feature or element of any embodiment may also be combined with feature(s) or element(s) from other technical solution(s) to form another technical solution defined by the claims. Therefore, it should be understood that any of the features shown and/or discussed in the present disclosure may be implemented individually or in any suitable combination. Therefore, the embodiments are not otherwise limited except in accordance with the appended claims and equivalents thereof. In addition, various modifications and changes may be made within the protection scope of the appended claims.

Unless otherwise defined, technical terms or scientific terms used in the present disclosure shall have common meanings as construed by a person of ordinary skill in the art to which the present disclosure pertains. The "first", "second", and similar terms used in the present disclosure do not indicate any order, number, or importance, but are used only for distinguishing different components. Similar words such as "including" or "comprising" mean that elements or articles preceding the words cover elements or articles listed after the words and their equivalents, and do not exclude other elements or articles. Terms like "connect" or "couple" are not limited to physical or mechanical connection, but may include electrical connection, whether direct or indirect. "Up", "down", "left", "right", etc. are only used to represent a relative position relationship that may change accordingly when an absolute position of an object described changes.

A transistor is an element that at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In this specification, the channel region refers to a region which the current mainly flows through. A first electrode may be a drain electrode and a second electrode may be a source electrode, or the first electrode may be a source electrode and the second electrode may be a drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification. In addition, there are two types of transistors: P-type transistor and N-type transistor, wherein the P-type transistor is turned on when its gate is at a low level and turned off when its gate is at a high level, and the N-type transistor is turned on when its gate is at a high level and turned off when its gate is at a low level.

With the maturity of OLED display technology, people's demand for high-frequency OLED display products is becoming more and more urgent. As for the high frequency OLED display products, a pixel circuit includes a drive transistor and a storage capacitor. Because the scan signal in the pixel circuit keeps an effective level for a short time, charges stored in the storage capacitor is insufficient, and a threshold voltage compensation for the drive transistor is insufficient, so that display of an OLED display product is uneven and the display effect of the OLED display product is reduced.

FIG. 1 is a schematic diagram of structure of a pixel circuit provided by an embodiment of the present disclosure. As shown in FIG. 1, the pixel circuit provided by the embodiment of the present disclosure is configured to drive a light emitting element to emit light. The pixel circuit includes: a first reset sub-circuit, a node control sub-circuit, a light emitting control sub-circuit and a second reset sub-circuit.

The first reset sub-circuit is connected with a first reset line RST1, a scan signal line Gate, an initial signal line Vinit and a first node N1, respectively, and configured to provide a signal of the initial signal line Vinit to the first node N1 under control of the first reset line RST1 and the scan signal line Gate. The node control sub-circuit is connected with the scan signal line Gate, a second reset line RST2, a data signal line Data, the first node N1, a second node N2, a third node N3 and a first power supply line VDD, respectively, and configured to provide a signal of the data signal line Data for the second node N2 under control of the scan signal line Gate, the second reset line RST2 and the first node N1, and compensate for the first node N1 through the second node N2 and the third node N3 until a voltage of the first node N1 satisfies a threshold condition, and provide the signal of the second node N2 to the third node N3 under control of the first node N1. The light emitting control sub-circuit is connected with a light emitting control line EM, the first power supply line VDD, the second node N2, the third node N3 and the light emitting element, respectively, and configured to provide a signal of the first power supply line VDD to the second node N2 and a signal of the third node N3 to the light emitting element under control of the light emitting control line EM. The second reset sub-circuit is connected with a third reset line RST3, the initial signal line Vinit and the light emitting element, respectively, and configured to provide the signal of the initial signal line Vinit to the light emitting element under control of the third reset line RST3. The light emitting element is connected with a second power supply line VSS.

In an exemplary embodiment, signals of the first reset line RST1, the second reset line RST2, the third reset line RST3, the scan signal line Gate, and the light emitting control line EM may be pulse signals.

In an exemplary embodiment, the first power supply terminal VDD may continuously provide a high level signal. The second power supply line VSS and the initial signal line Vinit may continuously provide a low level signal.

In an exemplary embodiment, the signal of the initial signal line Vinit may be a signal with a voltage value of 0V.

In an exemplary embodiment, a voltage value of a signal of the second power supply line VSS and a voltage value of a signal of the initial signal line Vinit may be the same or may be different.

In an exemplary embodiment, the signal of the initial signal line Vinit may be for reset of the light emitting element and the first node.

In an exemplary embodiment, the light emitting element may be an organic light emitting diode OLED. An anode of the organic light emitting diode OLED is connected with the light emitting control sub-circuit, and a cathode of the organic light emitting diode OLED is connected with the second power supply terminal VSS.

The pixel circuit provided by an embodiment of the present disclosure is configured to drive the light emitting element to emit light. The pixel circuit includes the first reset sub-circuit, the node control sub-circuit, the light emitting control sub-circuit and the second reset sub-circuit. The first reset sub-circuit is connected with the first reset line, the scan signal line, the initial signal line and the first node, respectively, and configured to provide the signal of the initial signal line for the first node under control of the first reset line and the scan signal line. The node control sub-circuit is connected with the scan signal line, the second reset line, the data signal line, the first node, the second node, the third node and the first power supply line, respectively, and configured to provide the signal of the data signal line to the second node under control of the scan signal line, the second reset line and the first node, and compensate for the first node through the second node and the third node until a voltage of the first node satisfies a threshold condition, and provide a signal of the second node to the third node under control of the first node. The light emitting control sub-circuit is connected with the light emitting control line, the first power line, the second node, the third node and the light emitting element, respectively, and configured to provide a signal of the first power line to the second node and a signal of the third node to the light emitting element under control of the light emitting control line. The second reset sub-circuit is connected to the third reset line, the initial signal line and the light emitting element, respectively, and configured to provide a signal of the initial signal line to the light emitting element under control of the third reset line. The light emitting element is connected with the second power supply line. The node control sub-circuit in the present disclosure simultaneously controls the compensation for the first node through the scan signal line and the second reset line, so that after the signal of the data signal line is written and before the light emitting element emits light, the first node may be continuously compensated until the first node satisfies the threshold condition, thereby enhancing the compensation effect and improving the display effect of the display product.

Figure 2:
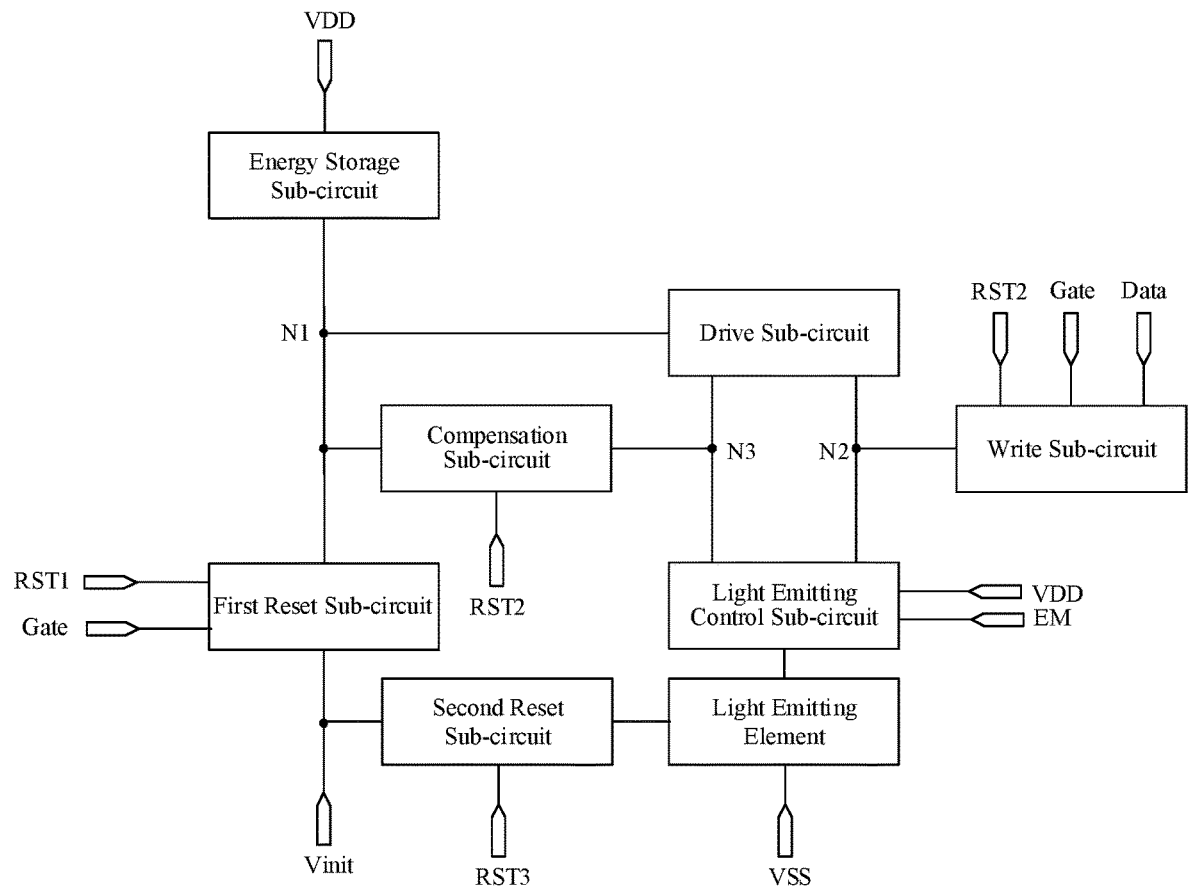
FIG. 2 is a schematic diagram of structure of a pixel circuit according to an exemplary embodiment.

FIG. 2 is a schematic diagram of structure of a pixel circuit provided by an exemplary embodiment. As shown in FIG. 2, a node control sub-circuit in the pixel circuit provided by an exemplary embodiment includes a write sub-circuit, a drive sub-circuit, a compensation sub-circuit and an energy storage sub-circuit.

The write sub-circuit is connected with a scan signal line Gate, a second reset line RST2, a data signal line Data, and a second node N2, respectively, and configured to provide a signal of the data signal line Data for the second node N2 under control of the scan signal line Gate and the second reset line RST2, and discharge to the second node N2 under control of the second reset line RST2. The drive sub-circuit is connected with the first node N1, the second node N2 and the third node N3, respectively, and configured to provide a signal of the second node N2 for the third node N3 under control of the first node N1. The compensation sub-circuit is connected with the first node N1, the second reset line RST2 and the third node N3, respectively, and configured to provide a potential of the third node N3 for the first node N1 under control of the second reset line RST2 to compensate for the first node N1 until a voltage of the first node N1 satisfies a threshold condition. The energy storage sub-circuit is connected with the first power supply line VDD and the first node N1, respectively, and configured to store a voltage difference between the first power supply line VDD and the first node N1.

FIG. 2 illustrates an exemplary structure of the node control sub-circuit, and implementations of the node control sub-circuit are not limited thereto.

Figure 3:
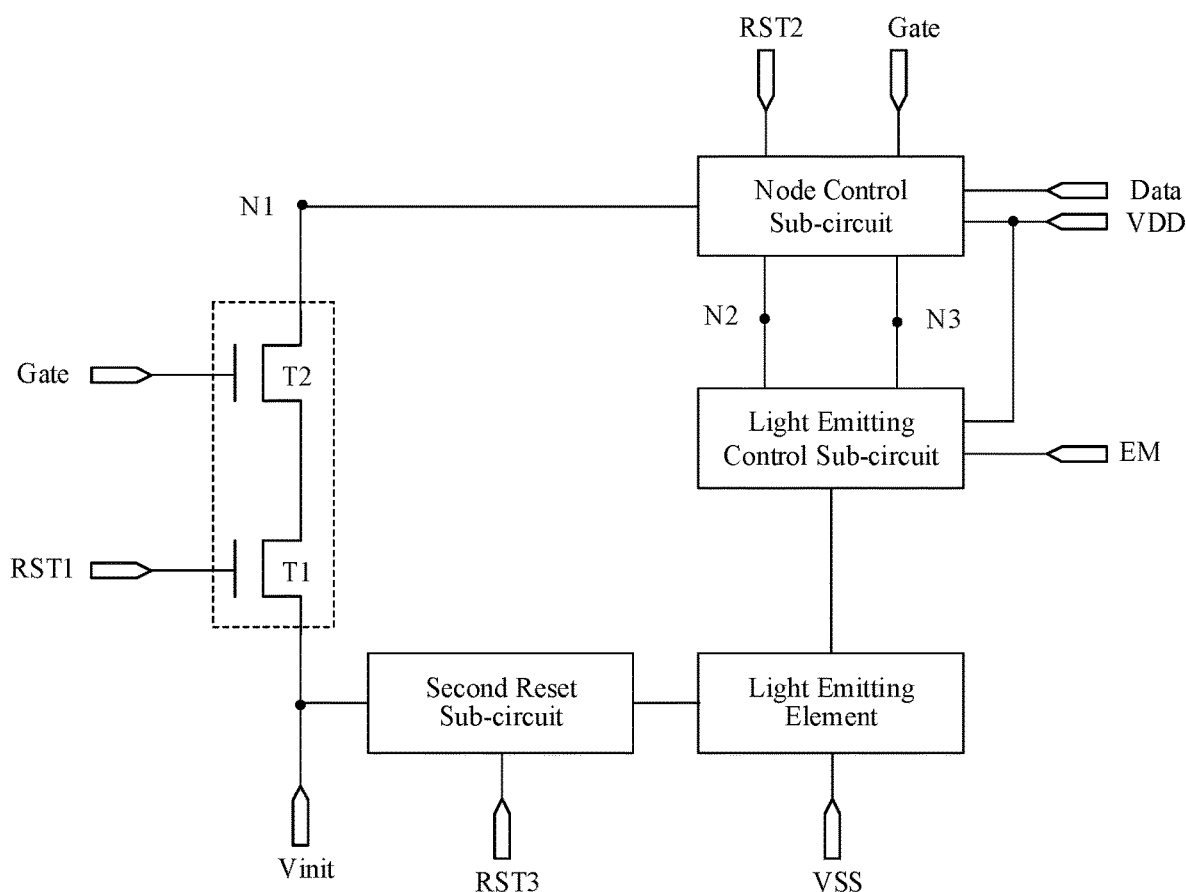
FIG. 3 is an equivalent circuit diagram of a first reset sub-circuit according to an exemplary embodiment.

FIG. 3 is an equivalent circuit diagram of a first reset sub-circuit provided by an exemplary embodiment. As shown in FIG. 3, in an exemplary embodiment, the first reset sub-circuit includes a first transistor T1 and a second transistor T2. The first transistor T1 and the second transistor T2 are switch transistors.

A control electrode of the first transistor T1 is connected with a first reset line RST1, a first electrode of the first transistor T1 is connected with an initial signal line Vinit, and a second electrode of the first transistor T1 is connected with a first electrode of the second transistor T2. A control electrode of the second transistor T2 is connected with a scan signal line Gate. A second electrode of the second transistor T2 is connected with a first node N1.

FIG. 3 illustrates an exemplary structure of the first reset sub-circuit, implementations of which are not limited thereto.

Figure 4:
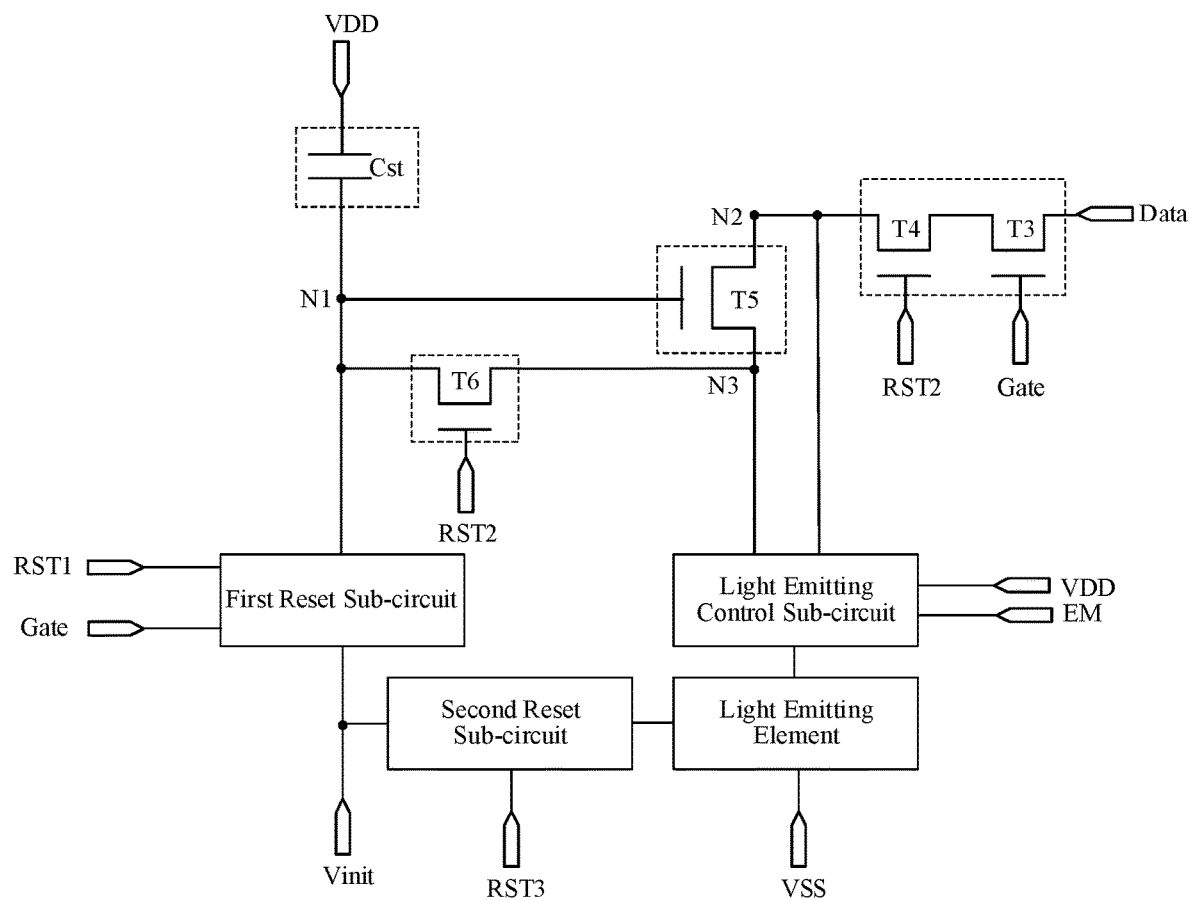
FIG. 4 is an equivalent circuit diagram of a node control sub-circuit according to an exemplary embodiment.

FIG. 4 is an equivalent circuit diagram of a node control sub-circuit provided by an exemplary embodiment. As shown in FIG. 4, in an exemplary embodiment, the write sub-circuit in the node control sub-circuit includes a third transistor T3 and a fourth transistor T4. The drive sub-circuit includes a fifth transistor T5 which is a drive transistor. The energy storage sub-circuit includes a storage capacitor Cst. The compensation sub-circuit includes a sixth transistor T6. The third transistor T3, the fourth transistor T4, and the sixth transistor T6 are switch transistors.

A control electrode of the third transistor T3 is connected with a scan signal line Gate, a first electrode of the third transistor T3 is connected with a data signal line Data, and a second electrode of the third transistor T3 is connected with a first electrode of the fourth transistor T4. A control electrode of the fourth transistor T4 is connected with a second reset line RST2, and a second electrode of the fourth transistor T4 is connected with a second node N2. A control electrode of the fifth transistor T5 is connected with a first node N1, and a first electrode of the fifth transistor T5 is connected with a second node N2, and a second electrode of the fifth transistor T5 is connected with a third node N3. A control electrode of the sixth transistor T6 is connected with the second reset line RST2, a first electrode of the sixth transistor T6 is connected with the first node N1, and a second electrode of the sixth transistor T6 is connected with the third node N3. A first end of the storage capacitor Cst is connected with a first power supply line VDD, and a second end of the storage capacitor Cst is connected with the first node N1.

In an exemplary embodiment, a length of a channel region of the fourth transistor T4 is greater than a threshold length, and a width of the channel region of the fourth transistor T4 is greater than a threshold width. When the fourth transistor T4 is turned on, the channel region of the fourth transistor T4 is conductive, and a capacitance is formed between the channel region and the control electrode of the fourth transistor T4. Since the length of the channel region of the fourth transistor T4 is greater than the threshold length and the width of the channel region of the fourth transistor T4 is greater than the threshold width, the capacitance value of the capacitance formed between the channel region and the control electrode of the fourth transistor T4 is larger. In this case, when the fourth transistor T4 is turned on, the fourth transistor T4 is equivalent to a capacitor and may be charged or discharged.

In an exemplary embodiment, the threshold length is a maximum value of lengths of conductive channels of the second transistor, the fourth transistor, and the fifth transistor, and the threshold width is a maximum value of widths of conductive channels of the second transistor, the fourth transistor, and the fifth transistor.

In an exemplary embodiment, the drive transistor may be an enhancement transistor or may be a depletion transistor.

In an exemplary embodiment, signals of the first power supply line VDD and the second power supply line VSS may be configured to enable that the drive transistor is in a saturated state when the drive transistor is turned on.

FIG. 4 illustrates an exemplary structure of a node control sub-circuit, and implementations of the node control sub-circuit are not limited thereto.

Figure 5:
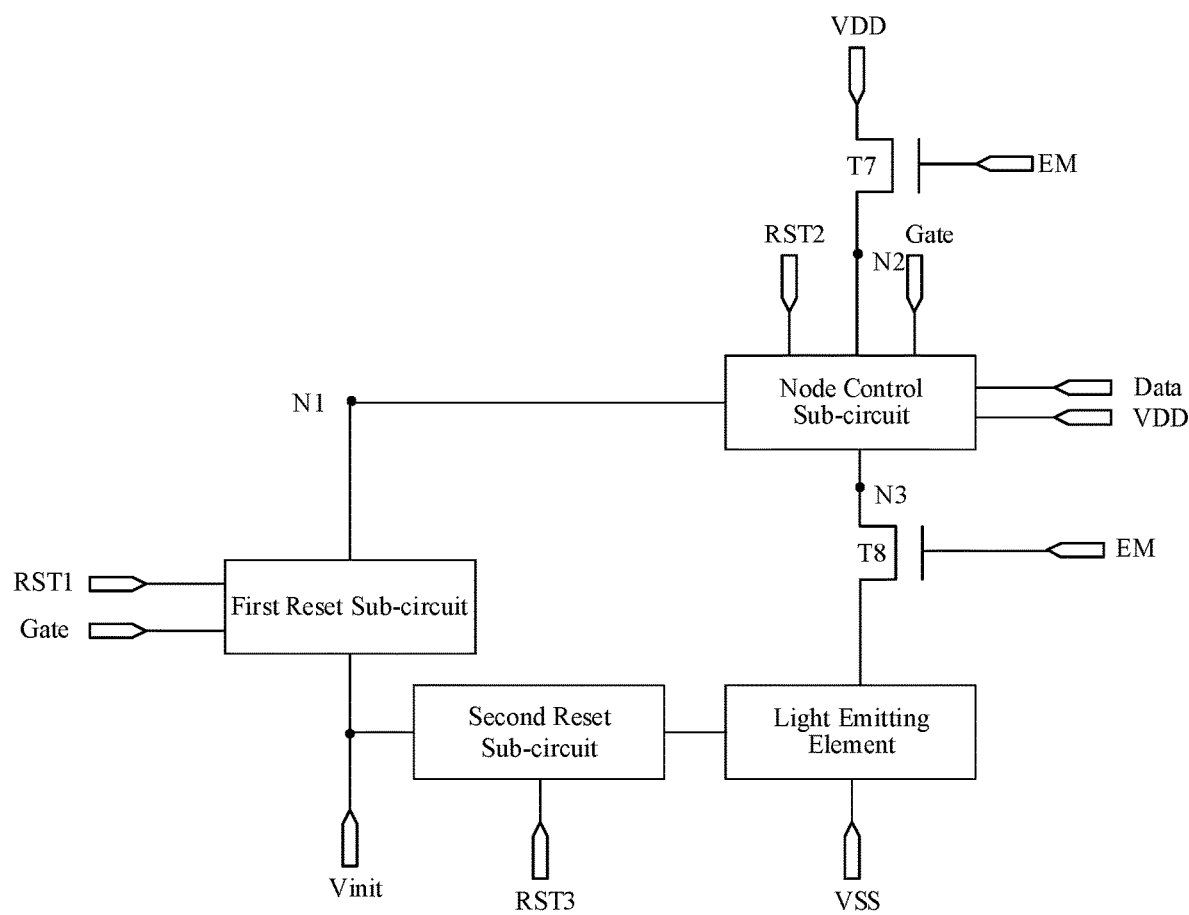
FIG. 5 is an equivalent circuit diagram of a light emitting control sub-circuit according to an exemplary embodiment.

FIG. 5 is an equivalent circuit diagram of a light emitting control sub-circuit provided by an exemplary embodiment. As shown in FIG. 5, in an exemplary embodiment, the light emitting control sub-circuit includes: a seventh transistor T7 and an eighth transistor T8. The seventh transistor T7 and the eighth transistor T8 are switch transistors.

A control electrode of the seventh transistor T7 is connected with a light emitting control signal line EM, a first electrode of the seventh transistor T7 is connected with a first power supply line VDD, and a second electrode of the seventh transistor T7 is connected with a second node N2. A control electrode of the eighth transistor T8 is connected with the light emitting signal line EM, a first electrode of the eighth transistor T8 is connected with a third node N3, and a second electrode of the eighth transistor T8 is connected with a light emitting element.

FIG. 5 illustrates an exemplary structure of a light emitting control sub-circuit, and implementations of the light emitting control sub-circuit are not limited thereto.

Figure 6:
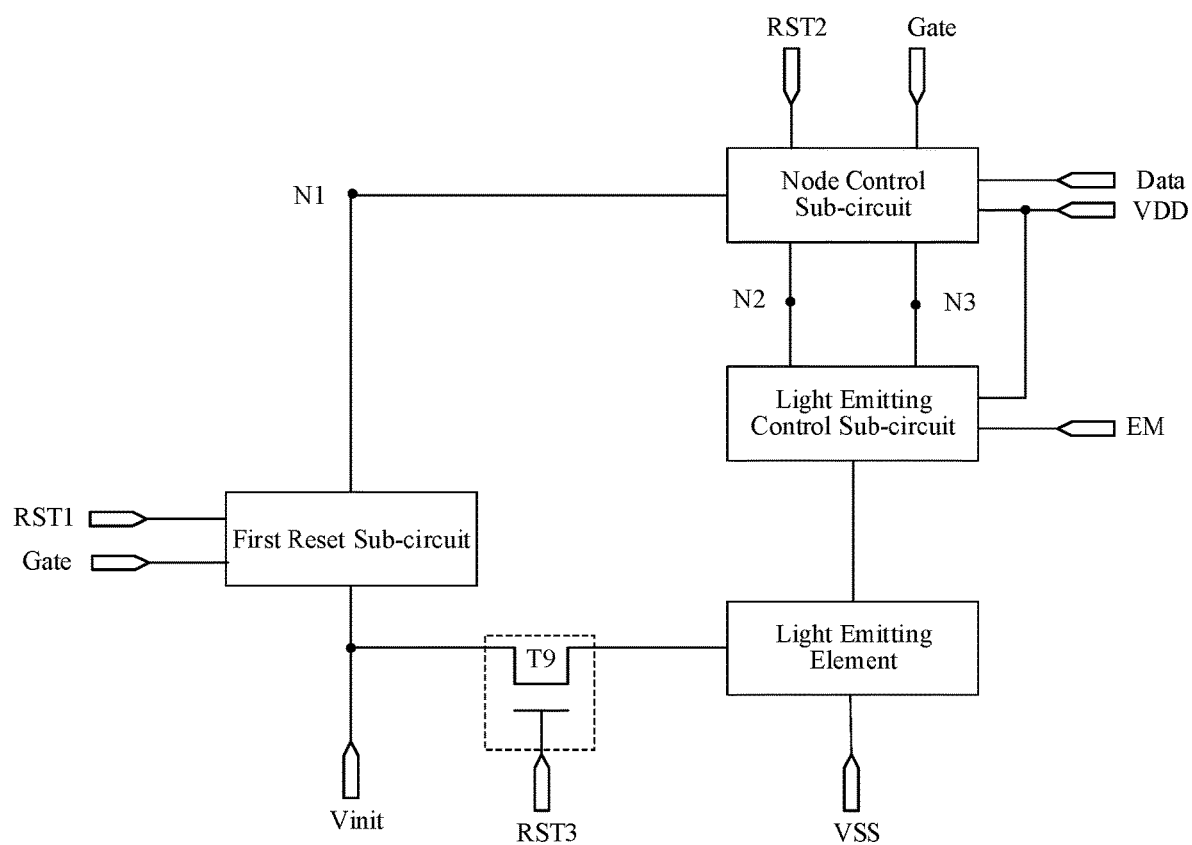
FIG. 6 is an equivalent circuit diagram of a second reset sub-circuit according to an exemplary embodiment.

FIG. 6 is an equivalent circuit diagram of a second reset sub-circuit provided by an exemplary embodiment. As shown in FIG. 6, in an exemplary embodiment, the second reset sub-circuit includes a ninth transistor T9. The ninth transistor T9 is a switch transistor.

A control electrode of the ninth transistor T9 is connected with a third reset line RST3, a first electrode of the ninth transistor T9 is connected with an initial signal line Vinit, and a second electrode of the ninth transistor T9 is connected with a light emitting element.

In an exemplary embodiment, the setting of the second reset sub-circuit can eliminate interface charges in the light emitting element and can improve the display effect of the display product.

FIG. 6 illustrates an exemplary structure of a second reset sub-circuit, and implementations of the second reset sub-circuit are not limited thereto.

Figure 7:
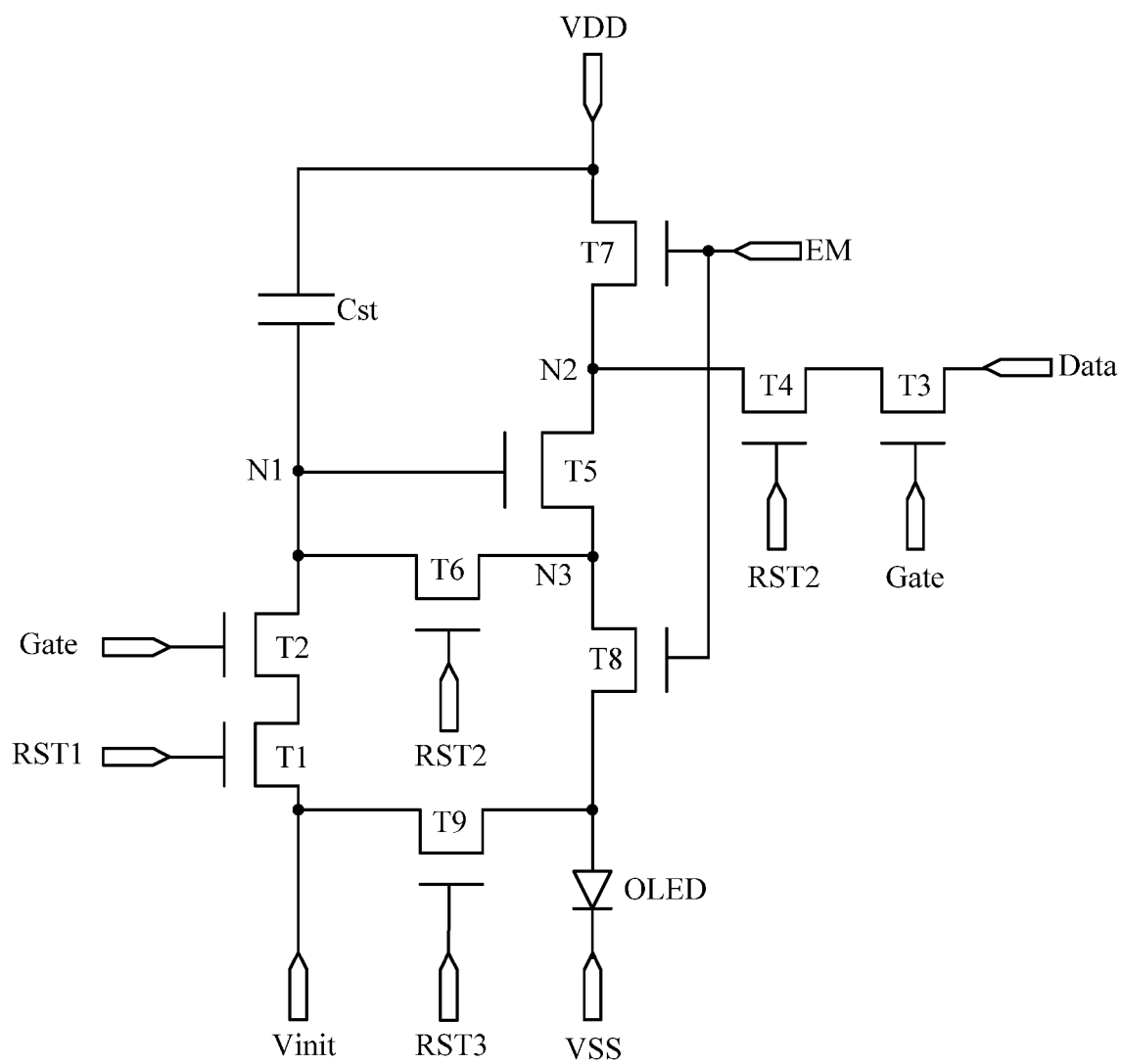
FIG. 7 is an equivalent circuit diagram of a pixel circuit according to an exemplary embodiment.

FIG. 7 is an equivalent circuit diagram of a pixel circuit provided by an exemplary embodiment. As shown in FIG. 7, in an exemplary embodiment, a first reset sub-circuit includes a first transistor T1 and a second transistor T2. A node control sub-circuit includes a third transistor T3, a fourth transistor T4, a fifth transistor T5, a sixth transistor T6 and a storage capacitor Cst. The fifth transistor T5 is a drive transistor. A light emitting control sub-circuit includes a seventh transistor T7 and an eighth transistor T8. A second reset sub-circuit includes a ninth transistor T9.

A control electrode of the first transistor T1 is connected with a first reset line RST1, a first electrode of the first transistor T1 is connected with an initial signal line Vinit, and a second electrode of the first transistor T1 is connected with a first electrode of the second transistor T2. A control electrode of the second transistor T2 is connected with a scan signal line Gate, a second electrode of the second transistor T2 is connected with a first node N1. A control electrode of the third transistor T3 is connected with a scan signal line Gate, a first electrode of the third transistor T3 is connected with a data signal line Data, and a second electrode of the third transistor T3 is connected with a first electrode of the fourth transistor T4. A control electrode of the fourth transistor T4 is connected with a second reset line RST2, and a second electrode of the fourth transistor T4 is connected with a second node N2. A control electrode of the fifth transistor T5 is connected with a first node N1, a first electrode of the fifth transistor T5 is connected with the second node N2, and a second electrode of the fifth transistor T5 is connected with a third node N3. A control electrode of the sixth transistor T6 is connected with a second reset line RST2, a first electrode of the sixth transistor T6 is connected with the first node N1, and a second electrode of the sixth transistor T6 is connected with the third node N3. A first end of the storage capacitor Cst is connected with a first power supply line VDD, and a second end of the storage capacitor Cst is connected with the first node N1. A control electrode of the seventh transistor T7 is connected with a light emitting control line EM, a first electrode of the seventh transistor T7 is connected with a first power supply line VDD, and a second electrode of the seventh transistor T7 is connected with the second node N2. A control electrode of the eighth transistor T8 is connected with the light emitting line EM, a first electrode of the eighth transistor T8 is connected with the third node N3, and a second electrode of the eighth transistor T8 is connected with a light emitting element. A control electrode of the ninth transistor T9 is connected with a third reset line RST3, a first electrode of the ninth transistor T9 is connected with an initial signal line Vinit, and a second electrode of the ninth transistor T9 is connected with a light emitting element.

In an exemplary embodiment, an anode of the organic light emitting diode OLED is connected with the second electrode of the eighth transistor T8 and the second electrode of the ninth transistor T9, respectively, and a cathode of the organic light emitting diode OLED is connected with a second power supply line VSS.

In an exemplary embodiment, the first transistor T1 to the ninth transistor T9 may be N-type thin film transistors, or may be P-type thin film transistors. The types of the transistors T1 to T9 may be the same or may be different. When the types of the transistors T1 through T9 are the same, the process flow may be unified, the number of the processes can be reduced, and the yield of products can be improved.

In an exemplary embodiment, the transistors T1 to T9 may be low temperature polysilicon thin film transistors. The low temperature polysilicon thin film transistor can reduce the drain current in the pixel circuit and improve the performance of the pixel circuit.

In an exemplary embodiment, the transistors T1 to T9 may be of a bottom gate structure or a top gate structure.

In an exemplary embodiment, the threshold condition is that a voltage of the first node N1 is equal to a difference between a voltage of a signal of a data signal line Data and an absolute value of a threshold voltage of the fifth transistor T5, so that the drive current flowing to the light emitting element is uncorrelated with the threshold voltage of the drive transistor, ensuring the uniformity of the display product.

In an exemplary embodiment, the scan signal line Gate and the third reset line RST may be different signal lines or may be the same signal line. When the scan signal line and the third reset line are the same signal line, the number of the signal lines in the pixel circuit can be reduced and an area occupied by the pixel circuit can be reduced.

A pixel circuit according to an exemplary embodiment will be described below through a working process of the pixel circuit.

Figure 8:
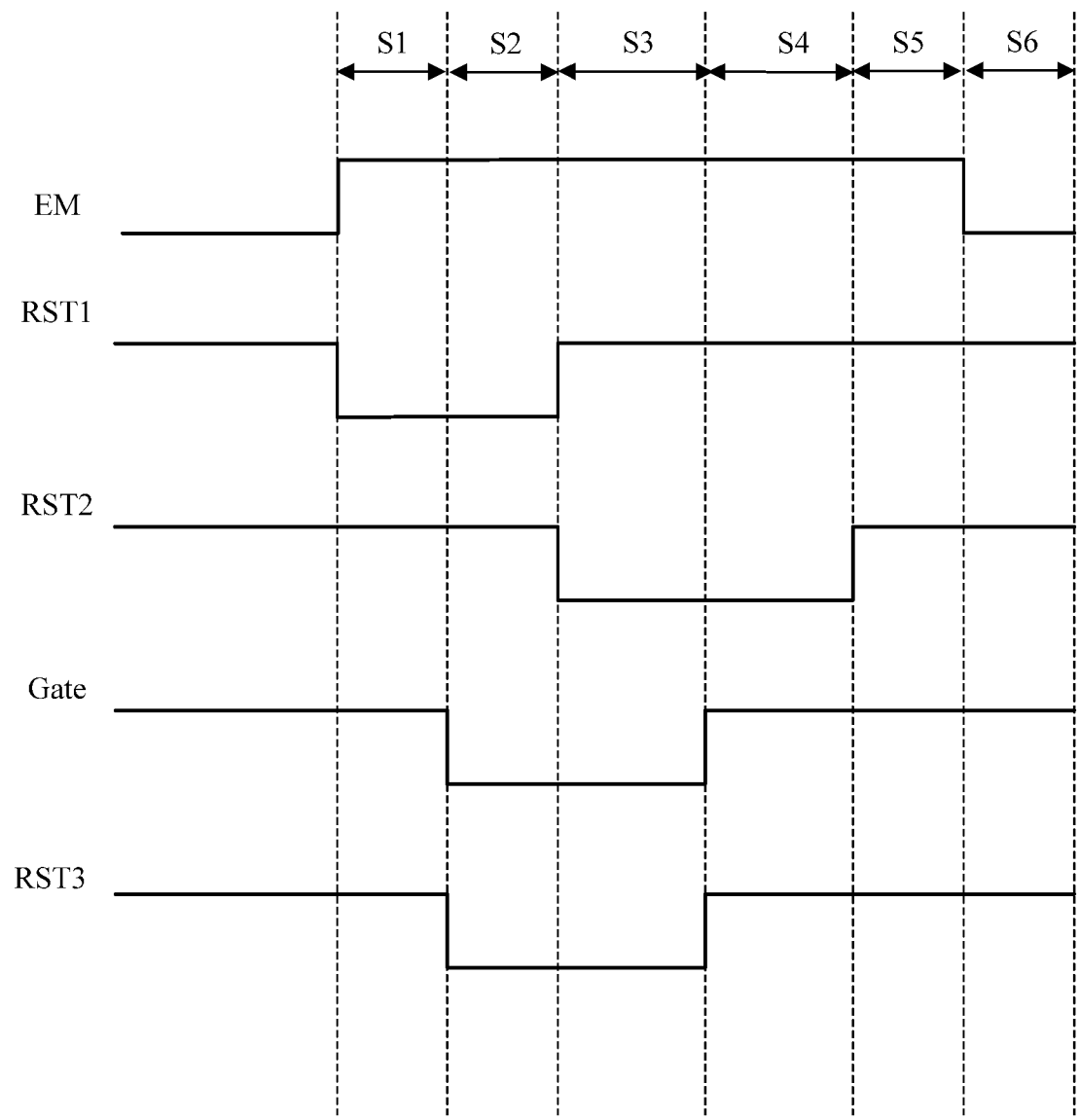
FIG. 8 is an operation timing diagram of a pixel circuit according to an exemplary embodiment.
Figure 9A:
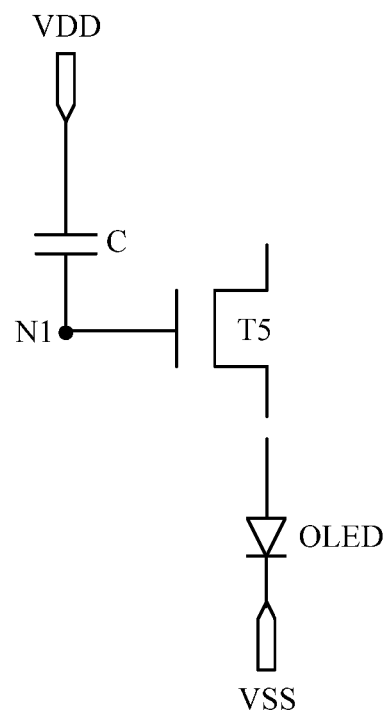
FIG. 9A is an equivalent circuit diagram of a pixel circuit in a first stage according to an exemplary embodiment.
Figure 9B:
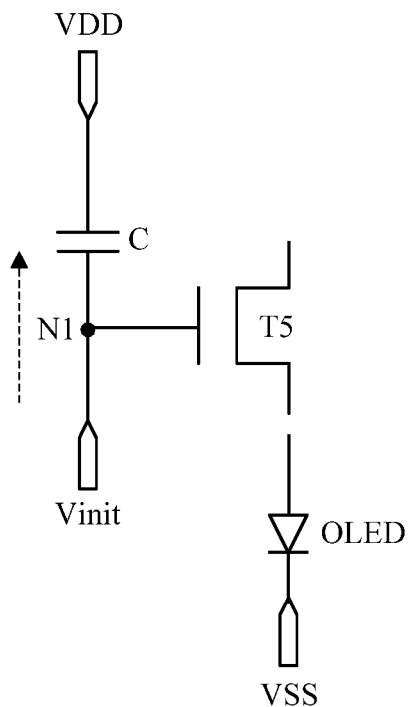
FIG. 9B is an equivalent circuit diagram of the pixel circuit in a second stage according to an exemplary embodiment.
Figure 9C:
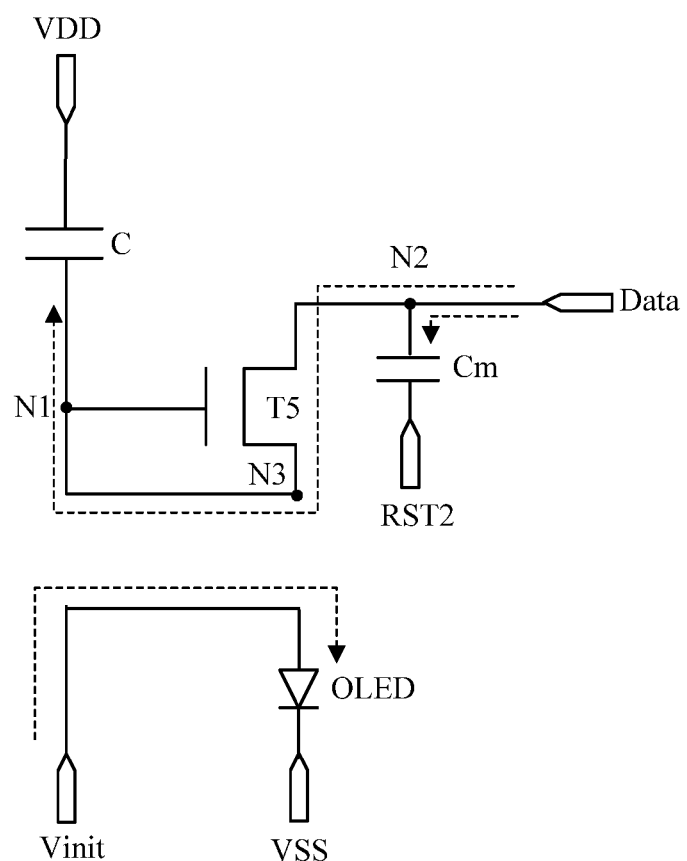
FIG. 9C is an equivalent circuit diagram of the pixel circuit in a third stage according to an exemplary embodiment.
Figure 9D:
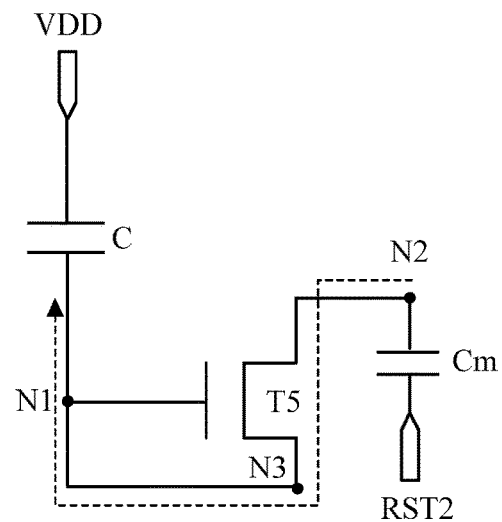
FIG. 9D is an equivalent circuit diagram of the pixel circuit in a fourth stage according to an exemplary embodiment.
Figure 9D:
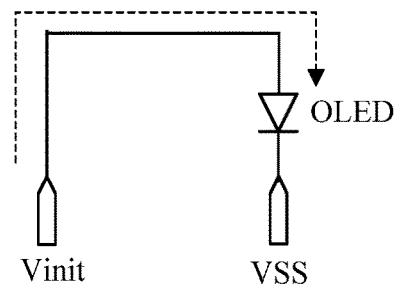
Figure 9E:
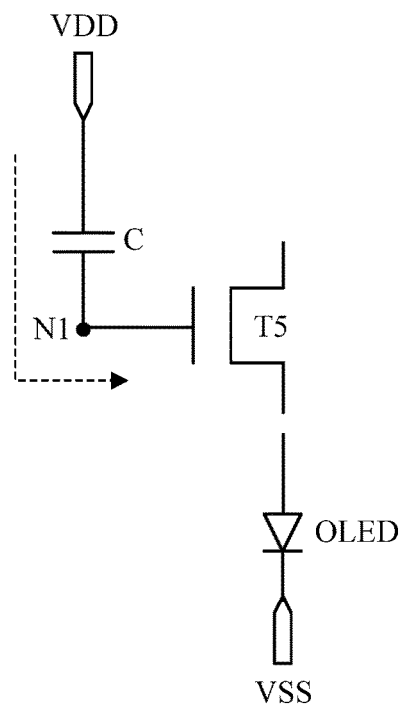
FIG. 9E is an equivalent circuit diagram of the pixel circuit in a fifth stage according to an exemplary embodiment.
Figure 9F:
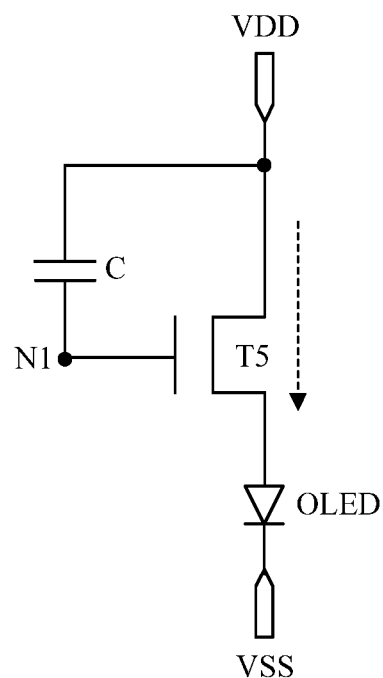
FIG. 9F is an equivalent circuit diagram of the pixel circuit in a sixth stage according to an exemplary embodiment.

Taking the transistors T1 to T9 in a pixel circuit being P-type transistors as an example, FIG. 8 is an operation timing diagram of a pixel circuit provided by an exemplary embodiment;

FIG. 9A is an equivalent circuit diagram of a pixel circuit in a first stage provided by an exemplary embodiment; FIG. 9B is an equivalent circuit diagram of the pixel circuit in a second stage provided by an exemplary embodiment; FIG. 9C is an equivalent circuit diagram of the pixel circuit in a third stage provided by an exemplary embodiment; FIG. 9D is an equivalent circuit diagram of the pixel circuit in a fourth stage provided by an exemplary embodiment; FIG. 9E is an equivalent circuit diagram of the pixel circuit in a fifth stage provided by an exemplary embodiment; FIG. 9F is an equivalent circuit diagram of the pixel circuit in a sixth stage provided by an exemplary embodiment. As shown in FIGS. 7 to 9, the pixel circuit according to an exemplary embodiment includes eight switch transistors (T1, T2, T3, T4, T6, T7, T8, and T9), one drive transistor (T5), one capacitor unit (Cst), six input signal lines (Gate, RST1, RST2, RST3, EM, and Data), and three power supply terminals (VDD, VSS, and Vinit).

The first power supply line VDD continuously provides a high level signal, and the second power supply line VSS and the initial signal line Vinit continuously provide a low level signal.

A pixel circuit provided by an exemplary embodiment includes a first stage S1 to a sixth stage S6.

In the first stage S1, namely a preparation stage, as shown in FIG. 9A, an input signal of a first reset line RST1 is at a low level, and a first transistor T1 is turned on. An input signal of a scan signal line Gate is at a high level, and a second transistor T2 and a third transistor T3 are turned off. An input signal of a second reset line RST2 is at a high level, and a fourth transistor T4 and a sixth transistor T6 are turned off. An input signal of a light emitting control line EM is at a high level, and a seventh transistor T7 and an eighth transistor T8 are turned off. An input signal of a third reset line RST3 is at a high level, and a ninth transistor T9 is turned off. Since the first transistor T1 is turned on and the second transistor T2 is turned off, a first node N1 cannot be reset. The first stage S1 is the preparation stage of a second stage S2.

In the second stage S2, namely a reset stage, as shown in FIG. 9B, the input signal of the first reset line RST1 is at a low level, and the first transistor T1 is turned on. The input signal of the scan signal line Gate is at a low level, and the second transistor T2 and the third transistor T3 are turned on. Since the first transistor T1 and the second transistor T2 are turned on, an initial signal line Vinit provides an initial signal for the first node N1 to start charging the first node N1. At this time, it is to start charging a storage capacitor Cst to prepare for the writing of a data signal in a third stage. Since a difference between a voltage value of the first node N1 and a voltage value of a second node N2 is greater than a threshold voltage of the fifth transistor, the fifth transistor T5 is turned on. The input signal of the third reset line RST3 is at a low level, the ninth transistor T9 is turned on, and the initial signal line Vinit provides the initial signal for an anode of an organic light emitting diode OLED to initialize the anode of the organic light emitting diode OLED. The input signal of the second reset line RST2 is at a high level, and the fourth transistor T4 and the sixth transistor T6 are turned off. The input signal of the light emitting control line EM is at a high level, and the seventh transistor T7 and the eighth transistor T8 are turned off.

In the third stage S3, namely a write compensation stage, as shown in FIG. 9C, the input signal of the scan signal line Gate is at a low level, and the second transistor T2 and the third transistor T3 are turned on. The input signal of the second reset line RST2 is at a low level, and the fourth transistor T4 and the sixth transistor T6 are turned on. Since the third transistor T3 and the fourth transistor T4 are turned on, the input signal of the data signal line Data is written to the second node N2. When the fourth transistor T4 is turned on, the fourth transistor T4 is equivalent to a capacitor Cm, the input signal of the data signal line Data charges the capacitor Cm through the third transistor T3, and the input signal of the data signal line Data charges the storage capacitor Cst through the third transistor T3, the fourth transistor T4, the fifth transistor T5 and the sixth transistor T6 to compensate for the first node N1. The voltage value of the second node N2 is quickly equal to the voltage value Vdata of the input signal of the data signal line Data over the charging time. At this time, a voltage difference across the capacitor Cm is V2-Vdata, where V2 is a voltage value of the second reset line RST2 in the third stage. Since the input signal of the data signal line Data charges the storage capacitor Cst through the fifth transistor T5, as the voltage value of the first node N1 rises, a current flowing through the fifth transistor T5 becomes smaller and smaller, and the voltage value of the first node N1 rises more and more slowly. Since an on time for each line of high-frequency display products is short, namely a time in which the input signal of the scan signal line Gate is at the low level is short, the voltage value of the first node N1 is smaller than Vdata-|Vth| at the end of the third stage S3, where Vth is the threshold voltage of the fifth transistor T5. The input signal of the scan signal line Gate is switched to be at the high level, the third transistor T3 is turned off, and the writing of the input signal of the data signal line Data is finished. The input signal of the third reset line RST3 is at a low level, the ninth transistor T9 is turned on, and the input signal of the initial signal line Vinit is provided to the anode of the organic light emitting diode OLED to initialize the anode of the organic light emitting diode. The input signal of the first reset line RST1 is at a high level, the first transistor T1 is turned off, the input signal of the light emitting control line EM is at a high level, and the seventh transistor T7 and the eighth transistor T8 are turned off.

In a fourth stage S4, namely a compensation stage, as shown in FIG. 9D, the input signal of the scan signal line Gate is at a high level, the second transistor T2 and the third transistor T3 are turned off, the input signal of the second reset line RST3 is at a low level, and the fourth transistor T4 and the sixth transistor T6 are turned on. Although the third transistor T3 is turned off and there is no signal to continue signal writing to the storage capacitor Cst, the input signal of the data signal line Data is written at one end of the capacitor Cm in the third stage. In this case, the capacitor Cm starts to discharge, and the storage capacitor Cst is continuously charged through the fifth transistor T5 and the sixth transistor T6 to compensate for the first node N1, and the voltage value of the first node N1 continues to rise until the fifth transistor T5 is turned off. In this case, the voltage value of the first node N1 satisfies the threshold condition, that is, the voltage value of the first node N1 is equal to Vdata-|Vth|. Since the voltage value of the first node N1 rises slightly in this stage and charges of the capacitor Cm consumed is limited, the capacitor Cm may be approximately a constant voltage source. The input signal of the first reset line RST1 is at a high level, and the first transistor T1 is turned off. The input signal of the light emitting control line EM is at a high level, and the seventh transistor T7 and the eighth transistor T8 are turned off. The input signal of the third reset line RST4 is at a high level, and the ninth transistor T9 is turned off.

In a fifth stage S5, namely a buffer stage, as shown in FIG. 9E, the input signal of the first reset line RST1 is at a high level, and the first transistor T1 is turned off. The input signal of the scan signal line Gate is at a high level, and the second transistor T2 and the third transistor T3 are turned off. The input signal of the second reset line RST2 is at a high level, and the fourth transistor T4 and the sixth transistor T6 are turned off. The input signal of the light emitting control line EM is at a high level, and the seventh transistor T7 and the eighth transistor T8 are turned off. The input signal of the third reset line RST3 is at a high level, and the ninth transistor T9 is turned off. In this stage, the voltage value of the first node N1 remains unchanged.

In an exemplary embodiment, the duration of the fifth stage S5 depends on a time point at which the falling edge of the input signal of the light emitting control line EM occurs.

In a sixth stage S6, namely a light emitting stage, as shown in FIG. 9F, the input signal of the light emitting control line EM is at a low level, the seventh transistor T7 and the eighth transistor T8 are turned on, the storage capacitor Cst starts discharging, the fifth transistor T5 is turned on, and the fifth transistor T5 outputs a drive current to drive the organic light emitting diode OLED to emit light. The input signal of the first reset line RST1 is at a high level, and the first transistor T1 is turned off. The input signal of the scan signal line Gate is at a high level, and the second transistor T2 and the third transistor T3 are turned off. The input signal of the second reset line RST2 is at a high level, and the fourth transistor T4 and the sixth transistor T6 are turned off. The input signal of the third reset line RST3 is at a high level, and the ninth transistor T9 is turned off.

The drive current $I_{OLED}$ satisfies the following formula:

$$I\text{OLED}=K(V\text{sg}-|V\text{th}|)^2=K(V\text{dd}-(V\text{data}-|V\text{th}|)-V\text{th})^2=K(V\text{dd}-V\text{data})^2$$

Where Vsg is a voltage difference between a source electrode and a gate electrode of the fifth transistor, Vdd is a voltage value of the signal of the first power supply line, and K is a constant related to process parameters and geometric dimensions of the fifth transistor T5.

It can be seen from the derivation results of the above current formula that in the light emitting stage, the drive current outputted by the fifth transistor T5 is not affected by the threshold voltage of the fifth transistor T5, and is only related to a signal of the data signal line, thereby eliminating an influence of the threshold voltage of the fifth transistor T5 on the drive current, ensuring the uniformity of the display brightness of the display product, and improving the display effect of the whole display product.

Figure 10:
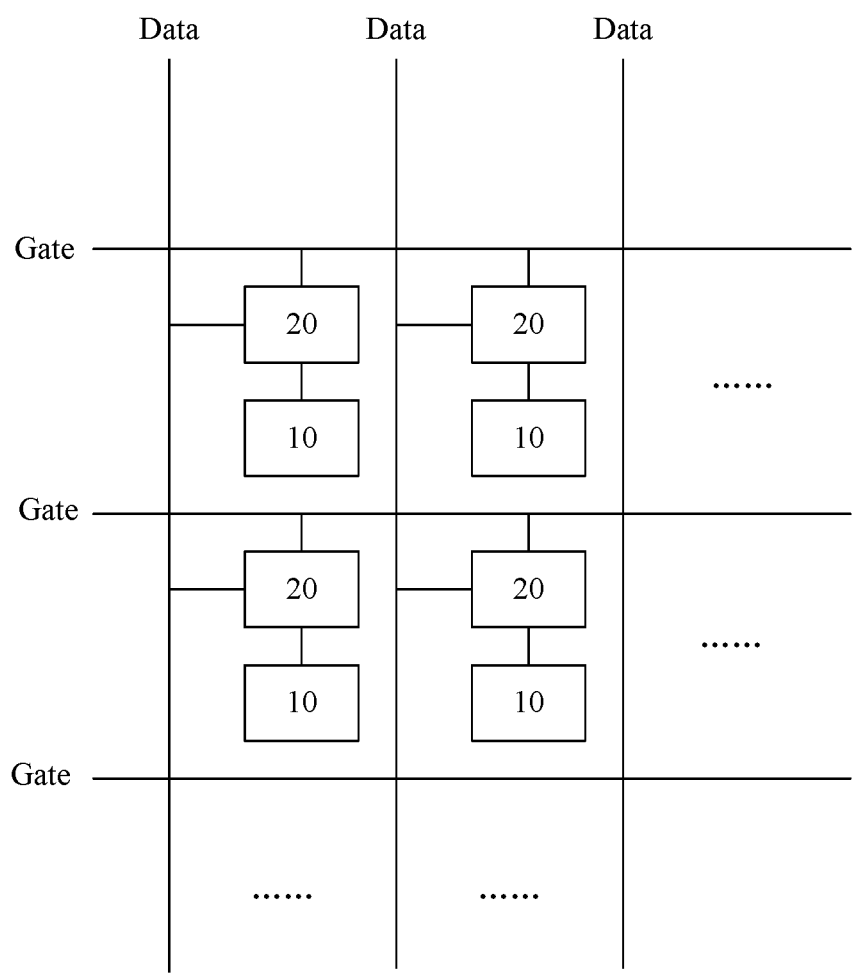
FIG. 10 is a schematic diagram of structure of a display apparatus provided by an embodiment of the present disclosure.
Figure 11:
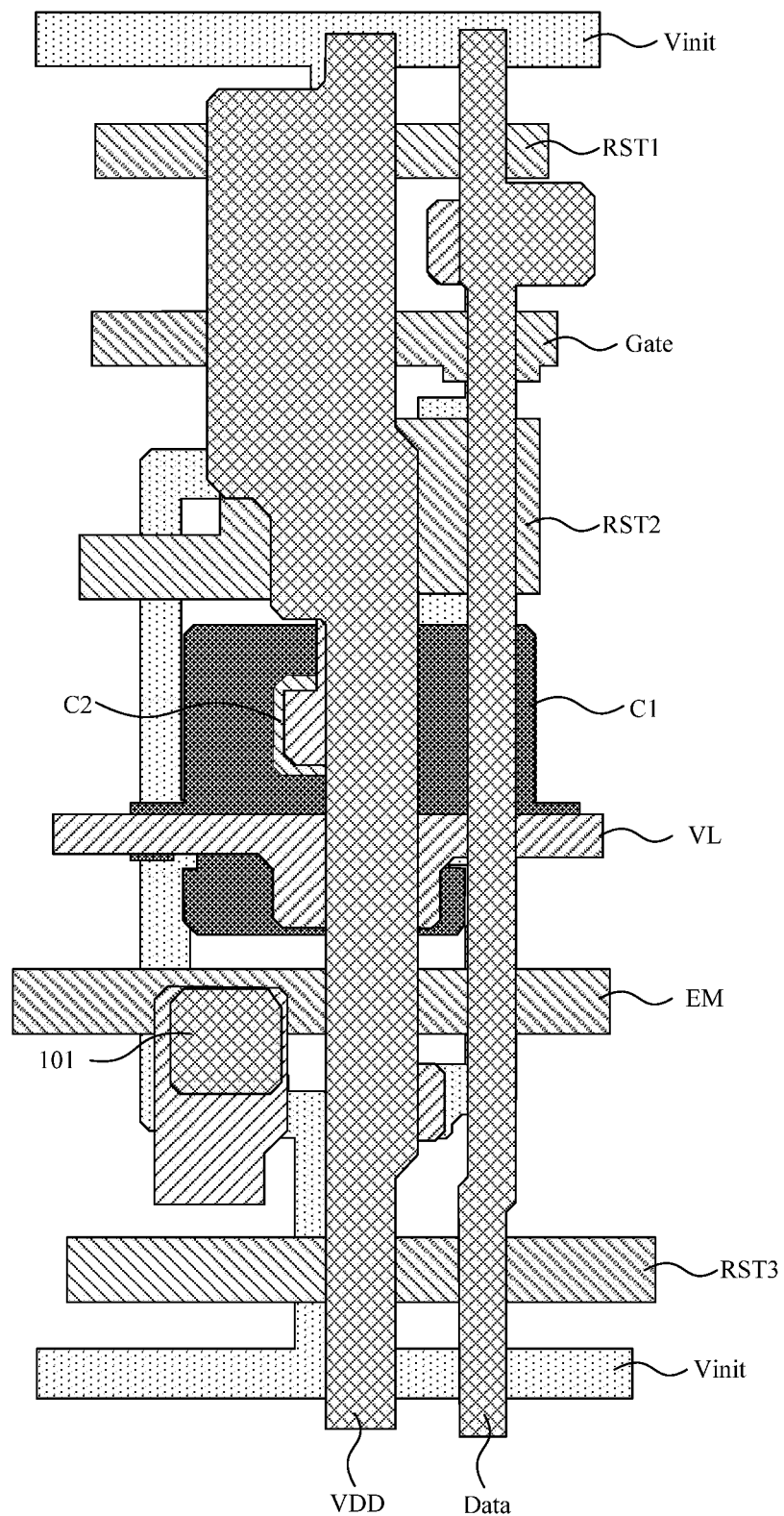
FIG. 11 is a partial top view of a display apparatus provided by an embodiment of the present disclosure.

An embodiment of the present disclosure further provides a display apparatus. FIG. 10 is a schematic diagram of structure of a display apparatus provided by an embodiment of the present disclosure. As shown in FIGS. 10 and 11, the display apparatus provided by the embodiment of the present disclosure includes light emitting elements 10 arranged in a matrix, pixel circuits 20 arranged in a matrix, a scan signal line Gate, a data signal line Data, an initial signal line Vinit, a light emitting control line EM, a first power supply line VDD, a first reset line RST1, a second reset line RST2, and a third reset line RST3. The third reset line connected with the pixel circuit located in an ith row is electrically connected with the first reset line connected with the pixel circuit located in an (i+1)th row, 1≤i<M, and M is the total number of rows of the pixel circuits.

The pixel circuit 20 is the pixel circuit provided by any of the foregoing embodiments. The pixel circuit corresponds to the light emitting element one by one, and is configured to drive the corresponding light emitting element to emit light.

The pixel circuit includes a first reset sub-circuit, a node control sub-circuit, a light emitting control sub-circuit, and a second reset sub-circuit. The first reset sub-circuit is connected with the first reset line, the scan signal line, the initial signal line and a first node, respectively, and configured to provide a signal of the initial signal line for the first node under control of the first reset line and the scan signal line. The node control sub-circuit is connected with the scan signal line, the second reset line, the data signal line, the first node, a second node, a third node and a first power supply line, respectively, and configured to provide a signal of the data signal line for the second node under control of the scan signal line, the second reset line and the first node, and compensate for the first node through the second node and the third node until a voltage of the first node satisfies a threshold condition, and provide a signal of the second node for the third node under control of the first node. The light emitting control sub-circuit is connected with the light emitting control line, the first power supply line, the second node, the third node and the light emitting element, respectively, and configured to provide the signal of the first power supply line for the second node and the signal of the third node for the light emitting element under control of the light emitting control line. The second reset sub-circuit is connected with the third reset line, the initial signal line and the light emitting element, respectively, and configured to provide the signal of the initial signal line for the light emitting element under control of the third reset line.

The display apparatus includes multiple sub-pixels. Each sub-pixel includes a light emitting element and a pixel circuit. The light emitting element in each sub-pixel is connected with the pixel circuit.

In an exemplary embodiment, the display apparatus may be any product or component with a display function, such as a mobile phone, a tablet computer, a television, a display, a notebook computer, a digital photo frame, a navigator.

In an exemplary embodiment, the display apparatus may include a base, and a drive structure layer and a light emitting structure layer that are sequentially arranged on the base. The drive structure layer includes a pixel circuit, a scan signal line, a data signal line, an initial signal line, a light emitting control line, a first power supply line, a first reset line, a second reset line and a third reset line. The light emitting structure layer includes a light emitting element.

In an exemplary embodiment, the base may be a rigid base or a flexible base. The rigid base may be, but is not limited to, one or more of glass and metal foil. The flexible base may be, but is not limited to, one or more of polyethylene terephthalate, ethylene terephthalate, polyether ether ketone, polystyrene, polycarbonate, polyarylate, polyimide, polyvinyl chloride, polyethylene, and textile fibers.

In an exemplary embodiment, as shown in FIG. 11, the scan signal line Gate, the initial signal line Vinit, the light emitting control line EM, the first reset line RST1, the second reset line RST2, and the third reset line RST3 extend in a first direction, and the data signal line Data and the first power supply line VDD extend in a second direction. The first direction intersects with the second direction.

In an exemplary embodiment, the first direction intersecting with the second direction means that an included angle between the first direction and the second direction ranges from about 70 degrees to 90 degrees. For example, the included angle between the first direction and the second direction may be 90 degrees.

In an exemplary embodiment, as shown in FIG. 11, each pixel circuit includes a storage capacitor. The storage capacitor includes a first plate C1 and a second plate C2. The first plate C1 is connected with the first power supply line VDD, and the second plate C2 is connected with the first node N1.

In an exemplary embodiment, an orthographic projection of the first plate C1 on the base partially overlaps an orthographic projection of the second plate on the base. The first plate C1 is provided with a via, and the via of the first plate C1 exposes the second plate C2.

In an exemplary embodiment, as shown in FIG. 11, the scan signal line Gate, the first reset line RST1 and the second reset line RST2 are located on a side of the second plate C2, and the light emitting control line EM and the third reset line RST3 are located on a side of the second plate C2 away from the first reset line RST1.

In an exemplary embodiment, as shown in FIG. 11, the first reset line RST1 is located on a side of the scan signal line Gate away from the second plate C2. The second reset line RST2 is located on a side of the scan signal line Gate close to the second plate C2. The third reset line RST3 is located on a side of the light emitting control line EM away from the second plate C2.

The initial signal line Vinit includes a first initial signal line and a second initial signal line. The first initial signal line and the first reset line are located on the same side of the second plate, and the first initial signal line is located on a side of the first reset line away from the second plate. The second initial signal line and the third reset line are located on the same side of the second plate, and the second initial signal line is located on a side of the third reset line away from the second plate.

In an exemplary embodiment, the first initial signal line connected with the pixel circuit is reused as the second initial signal line connected with a previous row of the pixel circuits, and the second initial signal line connected with the pixel circuit is reused as the first initial signal line connected with a next row of the pixel circuits.

In an exemplary embodiment, as shown in FIG. 11, the drive structure layer further includes a power supply connection line VL and a connection electrode 101.

In an exemplary embodiment, the power supply connection line VL is arranged in a layer different from a layer in which the first power supply line is arranged, and is connected with the first power supply line VDD. The first plate C1 is connected with the first power supply line VDD through the power supply connection line VL.

In an exemplary embodiment, an orthographic projection of the power supply connection line VL on the base at least partially overlaps an orthographic projection of the first plate C1 on the base, and at least partially overlaps an orthographic projection of the first power supply line VDD on the base.

In an exemplary embodiment, the connection electrode 101 is configured to connect the pixel circuit and the light emitting element.

In an exemplary embodiment, each transistor of a first transistor to a ninth transistor in the pixel circuit includes an active layer, a control electrode, a first electrode, and a second electrode. The drive structure layer includes the active layer, a first insulation layer, a first metal layer, a second insulation layer, a second metal layer, a third insulation layer, a third metal layer, a fourth insulation layer, a first planarization layer, a fourth metal layer and a second planarization layer, which are sequentially arranged in a direction perpendicular to the base.

In an exemplary embodiment, as shown in FIG. 11, the active layer includes active layers of the initial signal line Vinit and all transistors. The active layers of the initial signal line Vinit and all transistors are arranged on the same layer and formed in the same patterning process.

The active layers of all transistors include an active layer of a first transistor, an active layer of a second transistor, an active layer of a third transistor, an active layer of a fourth transistor, an active layer of a fifth transistor, an active layer of a sixth transistor, an active layer of a seventh transistor, an active layer of an eighth transistor and an active layer of a ninth transistor.

In an exemplary embodiment, as shown in FIG. 11, the first metal layer includes the scan signal line Gate, the first reset line RST1, the second reset line RST2, the second plate C2, the light emitting control line EM, the third reset line RST3, and control electrodes of all transistors.

In an exemplary embodiment, the scan signal line Gate, the first reset line RST1, the second reset line RST2, the second electrode C2, the light emitting control line EM, the third reset line RST3 and the control electrodes of all transistors are arranged in the same layer and formed in the same patterning process.

The control electrodes of all transistors include a control electrode of a first transistor, a control electrode of a second transistor, a control electrode of a third transistor, a control electrode of a fourth transistor, a control electrode of a fifth transistor, a control electrode of a sixth transistor, a control electrode of a seventh transistor, a control electrode of an eighth transistor and a control electrode of a ninth transistor.

In an exemplary embodiment, the control electrode of the first transistor, the control electrode of the second transistor, the control electrode of the third transistor, the control electrode of the fourth transistor and the control electrode of the sixth transistor are located on a first side of the second plate. The control electrode of the seventh transistor, the control electrode of the eighth transistor and the control electrode of the ninth transistor are located on a second side of the second plate, and the first side and the second side are arranged oppositely to each other.

In an exemplary embodiment, the control electrode of the second transistor is located on a side of the control electrode of the first transistor close to the second plate. The control electrode of the second transistor and the control electrode of the third transistor are an integrated structure. The control electrode of the fourth transistor is located on a side of the control electrode of the second transistor close to the second plate. The control electrode of the fourth transistor and the control electrode of the sixth transistor are an integrated structure. The second plate and the control electrode of the fifth transistor are an integrated structure. The control electrode of the seventh transistor and the control electrode of the eighth transistor are an integrated structure. The control electrode of the ninth transistor is located on a side of the control electrode of the seventh transistor away from the second plate.

In an exemplary embodiment, as shown in FIG. 11, the second metal layer includes the first plate C1.

In an exemplary embodiment, as shown in FIG. 11, the third metal layer includes the power supply connection line VL, and the first electrodes or the second electrodes of a part of the transistors. In an exemplary embodiment, the third metal layer includes the power supply connection line VL, the second electrode of the second transistor, the first electrode of the third transistor, the first electrode of the sixth transistor, the first electrode of the seventh transistor, the second electrode of the eighth transistor, and the second electrode of the ninth transistor.

In an exemplary embodiment, the power supply connection line VL, the second electrode of the second transistor, the first electrode of the third transistor, the first electrode of the sixth transistor, the first electrode of the seventh transistor, the second electrode of the eighth transistor and the second electrode of the ninth transistor are arranged in the same layer and formed in the same patterning process.

In an exemplary embodiment, the second electrode of the eighth transistor and the second electrode of the ninth transistor are the same electrode, and the second electrode of the second transistor and the first electrode of the sixth transistor are the same electrode.

In an exemplary embodiment, the active layer is also reused as first electrodes or second electrodes of transistors other than the first electrodes or the second electrodes of the part of the transistors included in the third metal layer. That is, the active layer is reused as the first electrode of the first transistor, the second electrode of the first transistor, the first electrode of the second transistor, the second electrode of the third transistor, the first electrode of the fourth transistor, the second electrode of the fourth transistor, the first electrode of the fifth transistor, the second electrode of the fifth transistor, the second electrode of the sixth transistor, the second electrode of the seventh transistor, the first electrode of the eighth transistor and the first electrode of the ninth transistor.

In an exemplary embodiment, the second electrode 14 of the first transistor and the first electrode 23 of the second transistor are the same electrode. The second electrode 34 of the third transistor and the first electrode 43 of the fourth transistor are the same electrode. The second electrode 44 of the fourth transistor, the first electrode 53 of the fifth transistor and the second electrode 74 of the seventh transistor are the same electrode. The second electrode 54 of the fifth transistor, the second electrode 64 of the sixth transistor and the first electrode 83 of the eighth transistor are the same electrode.

In an exemplary embodiment, as shown in FIG. 11, the fourth metal layer includes the first power supply line VDD, the data signal line Data and a pixel electrode 101. The first power supply line VDD, the data signal line Data and the pixel electrode 101 are arranged in the same layer and formed in the same patterning process.

In an exemplary embodiment, a first via, a second via, a third via, and a fourth via are provided on the first insulation layer, the second insulation layer, and the third insulation layer. A fifth via is arranged on the second insulation layer and the third insulation layer. A sixth via is arranged on the third insulation layer. A seventh via, an eighth via and a ninth via are arranged on the fourth insulation layer and the first planarization layer. The second planarization layer includes a tenth via.

The first via exposes the active layer of the third transistor, and the first electrode of the third transistor is connected with the active layer of the third transistor through the first via. The second via exposes the active layer of the second transistor, and the second electrode of the second transistor is connected with the active layer of the second transistor through the second via. The third via exposes the active layer of the eighth transistor, and the second electrode of the eighth transistor is connected with the active layer of the eighth transistor through the third via. The fourth via exposes the active layer of the seventh transistor, and the first electrode of the seventh transistor is connected with the active layer of the seventh transistor through the fourth via. The fifth via exposes the second plate, and the second electrode of the second transistor is connected with the second plate through the fifth via. The sixth via exposes the first plate, and the power supply connection line is connected with the first plate through the sixth via. The seventh via exposes the first electrode of the third transistor, and the data signal line is connected with the first electrode of the third transistor through the seventh via. The eighth via exposes a power supply connection line, and the first power supply line is connected with the power supply connection line through the eighth via. The ninth via exposes the second electrode of the eighth transistor, and the connection electrode is connected with the second electrode of the eighth transistor through the ninth via. The tenth via exposes the connection electrode, and the light emitting element is connected with the connection electrode through the tenth via.

In an exemplary embodiment, the number of vias in the third insulation layer is relatively small, which can reduce a space occupied by the pixel circuit and facilitate the realization of high resolution of the display apparatus.

In an exemplary embodiment, the light emitting element includes the first electrode, the second electrode and an organic light emitting layer. The first electrode is located on a side of the organic light emitting layer close to the base, and the second electrode is located on a side of the organic light emitting layer away from the base.

In an exemplary embodiment, the light emitting structure layer includes a pixel define layer, a transparent conductive layer, an organic material layer, and a conductive layer. The transparent conductive layer includes the first electrode. The organic material layer includes an organic light emitting layer. The conductive layer includes the second electrode.

In an exemplary embodiment, all the transistors adopted in the pixel circuit may be thin film transistors or field effect transistors or other switch devices with the same characteristics. Here, taking a thin film transistor as an example for illustration, for example, the active layer (channel region) of the transistor adopts a semiconductor material, such as polysilicon (such as low temperature polysilicon or high temperature polysilicon), amorphous silicon, and indium gallium tin oxide (IGZO). The control electrode, the first electrode, the second electrode and the like adopt a metal material, such as metal aluminum or aluminum alloy. The first electrode and the second electrode of the transistor adopted here may be symmetrical in structure, and thus there may be no difference in structure between the first electrode and the second electrode.

A structure of a display apparatus provided by an exemplary embodiment is described below through a preparation process for the display apparatus. A "patterning process" includes processes, such as deposition film layer, coating photoresist, mask exposure, development, etching, and stripping photoresist. The deposition may be any one or more of sputtering, evaporation and chemical vapor deposition. The coating may be any one or more of spray coating and spin coating. The etching may be any one or more of dry etching and wet etching. A "thin film" refers to a layer of film formed by a certain material on the base using a deposition or coating process. If the "thin film" does not need the patterning process in the entire manufacturing process, the "thin film" may also be called a "layer". If the "thin film" needs the patterning process in the entire manufacturing process, the "thin film" is called the "thin film" before the patterning process, and is called the "layer" after the patterning process. "A and B being arranged in the same layer" in the present disclosure means that A and B are formed simultaneously through the same patterning process.

FIGS. 12 to 19 are schematic diagrams of a preparation process for a display apparatus provided by an exemplary embodiment, illustrating a layout structure of a sub-pixel in the display apparatus. Each sub-pixel includes one pixel circuit. The pixel circuit includes the first transistor T1 to the ninth transistor T9 and a storage capacitor. The storage capacitor includes a first plate C1 and a second plate C2.

Figure 12:
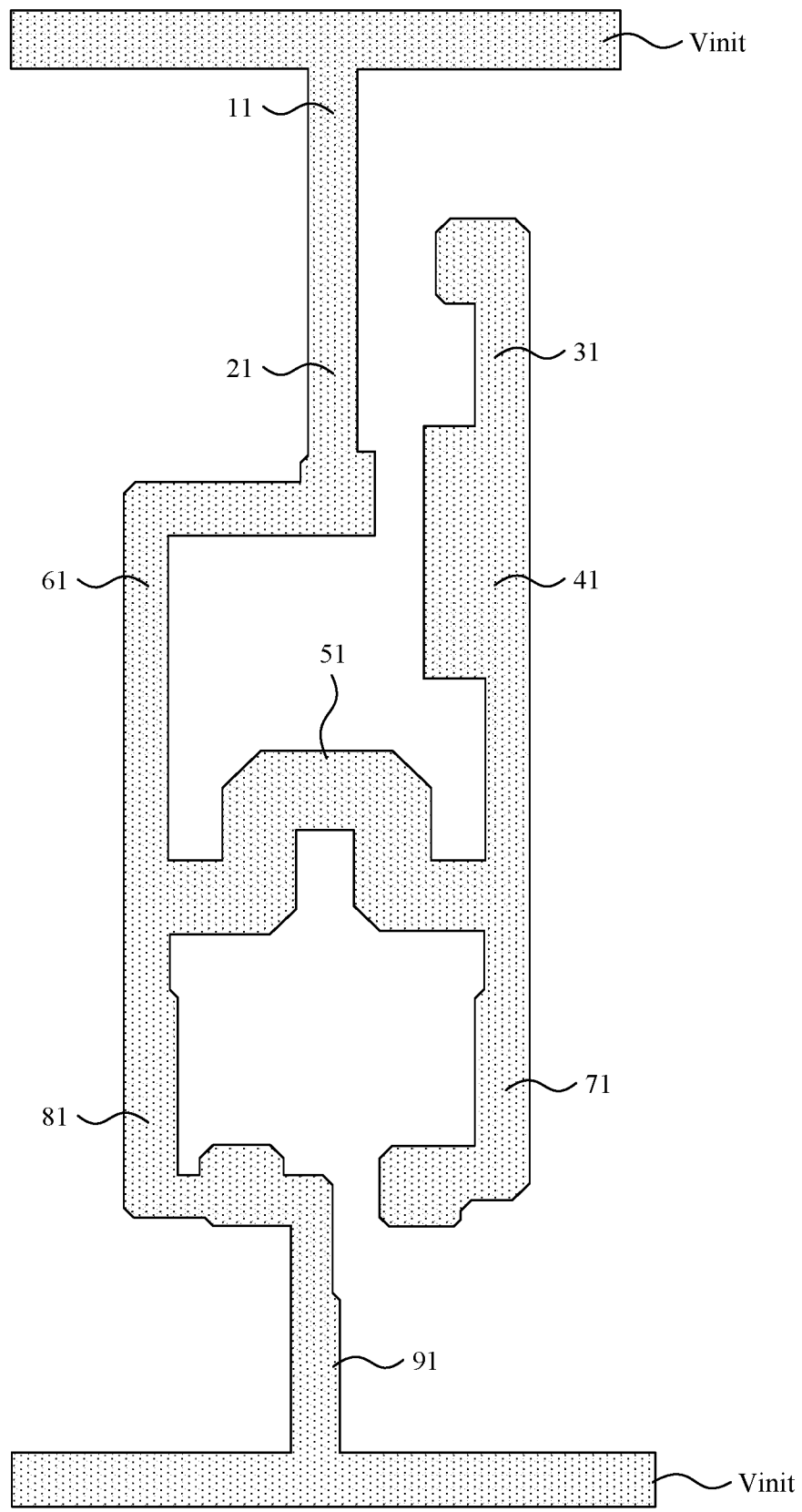
FIG. 12 is a schematic diagram of forming an active layer.

(1) Forming an active layer on a base, which includes: depositing a semiconductor thin film on the base; and patterning the semiconductor thin film by a patterning process to form the active layer. The active layer includes an initial signal line Vinit, an active layer 11 of a first transistor, an active layer 21 of a second transistor, an active layer 31 of a third transistor, an active layer 41 of a fourth transistor, an active layer 51 of a fifth transistor, an active layer 61 of a sixth transistor, an active layer 71 of a seventh transistor, an active layer 81 of an eighth transistor, and an active layer 91 of a ninth transistor, as shown in FIG. 12.

Figure 13:
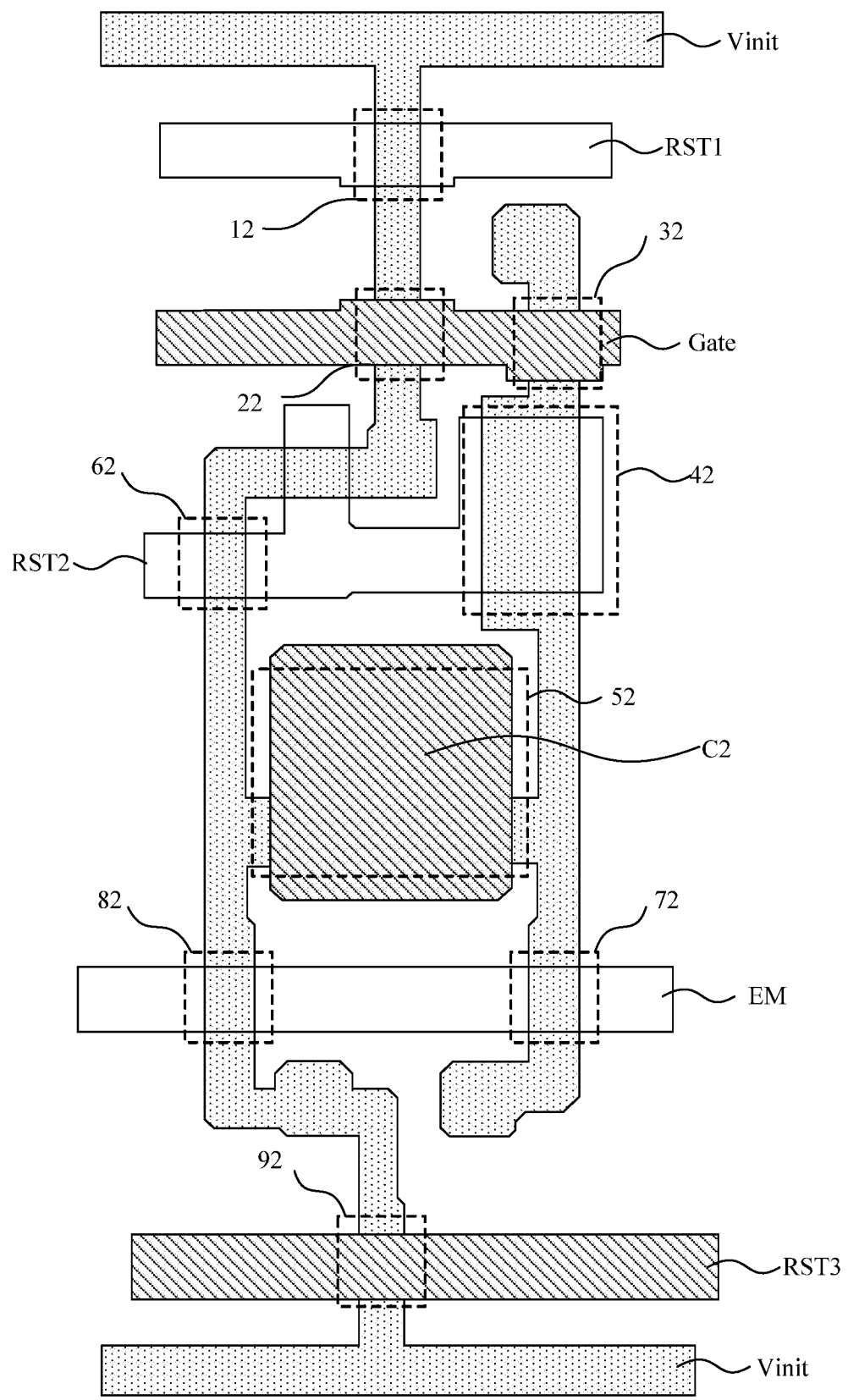
FIG. 13 is a schematic diagram of forming a first metal layer.

(2) Forming a first metal layer, which includes: depositing a first insulation thin film on the base on which the active layer is formed, and patterning the first insulation thin film through a patterning process to form a first insulation layer; depositing a first metal thin film on the first insulation layer, and patterning the first metal thin film by a patterning process to form the first metal layer. The first metal layer includes: a scan the signal line Gate, a first reset line RST1, a second reset line RST2, a second plate C2, a light emitting control line EM, a third reset line RST3, a control electrode 12 of the first transistor, a control electrode 22 of the second transistor, a control electrode 32 of the third transistor, a control electrode 42 of the fourth transistor, a control electrode 52 of the fifth transistor, a control electrode 62 of the sixth transistor, a control electrode 72 of the seventh transistor, a control electrode 82 of the eighth transistor and a control electrode 92 of the ninth transistor, as shown in FIG. 13.

In an exemplary embodiment, the first reset line RST1, the scan signal line Gate, the first reset line RST1, the light emitting control line EM, and the third reset line RST3 are arranged in parallel and extend in a first direction. The first reset line RST1, the scan signal line Gate, and the first reset line RST1 are located on a first side of the second plate C2, and the light emitting control line EM and the third reset line RST3 are located on a second side of the second plate C2, and the first side and the second side are arranged oppositely to each other.

In an exemplary embodiment, the control electrode 12 of the first transistor is an integrated structure connected with the first reset line RST1, and spans the active layer 11 of the first transistor. The control electrode 22 of the second transistor is an integrated structure connected with the scan signal line Gate, and spans the active layer 21 of the second transistor. The control electrode 32 of the third transistor is an integrated structure connected with the scan signal line Gate, and spans the active layer 31 of the third transistor. The control electrode 42 of the fourth transistor is an integrated structure connected with the second reset line RST2, and spans the active layer 41 of the fourth transistor. The control electrode 52 of the fifth transistor is an integrated structure connected with the second plate C2, and spans the active layer 51 of the fifth transistor. The control electrode 62 of the sixth transistor is an integrated structure connected with the second reset line RST2, and spans the active layer 61 of the sixth transistor. The control electrode 72 of the seventh transistor is an integrated structure connected with the light emitting control line EM, and spans the active layer 71 of the seventh transistor. The control electrode 82 of the eighth transistor is an integrated structure connected with the light emitting control line EM, and spans the active layer 81 of the eighth transistor. The control electrode 92 of the ninth transistor is an integrated structure connected with the third reset line RST3, and spans the active layer 91 of the ninth transistor.

In an exemplary embodiment, this process further includes a conductive treatment. The conductive treatment includes: after the first metal layer is formed, plasma processing is performed on the active layer using the control electrode 12 of the first transistor, the control electrode 22 of the second transistor, the control electrode 32 of the third transistor, the control electrode 42 of the fourth transistor, the control electrode 52 of the fifth transistor, the control electrode 62 of the sixth transistor, the control electrode 72 of the seventh transistor, the control electrode 82 of the eighth transistor, and the control electrode 92 of the ninth transistor as shields, and active layers in a region shielded by the control electrode 12 of the first transistor, the control electrode 22 of the second transistor, the control electrode 32 of the third transistor, the control electrode 42 of the fourth transistor, the control electrode 52 of the fifth transistor, the control electrode 62 of the sixth transistor, the control electrode 72 of the seventh transistor, the control electrode 82 of the eighth transistor and the control electrode 92 of the ninth transistor is used as channel regions of the transistors, and active layers in a region not shielded by the first metal layer are processed into a conductive layer to form a conductive source-drain region and the initial signal line.

Figure 14:
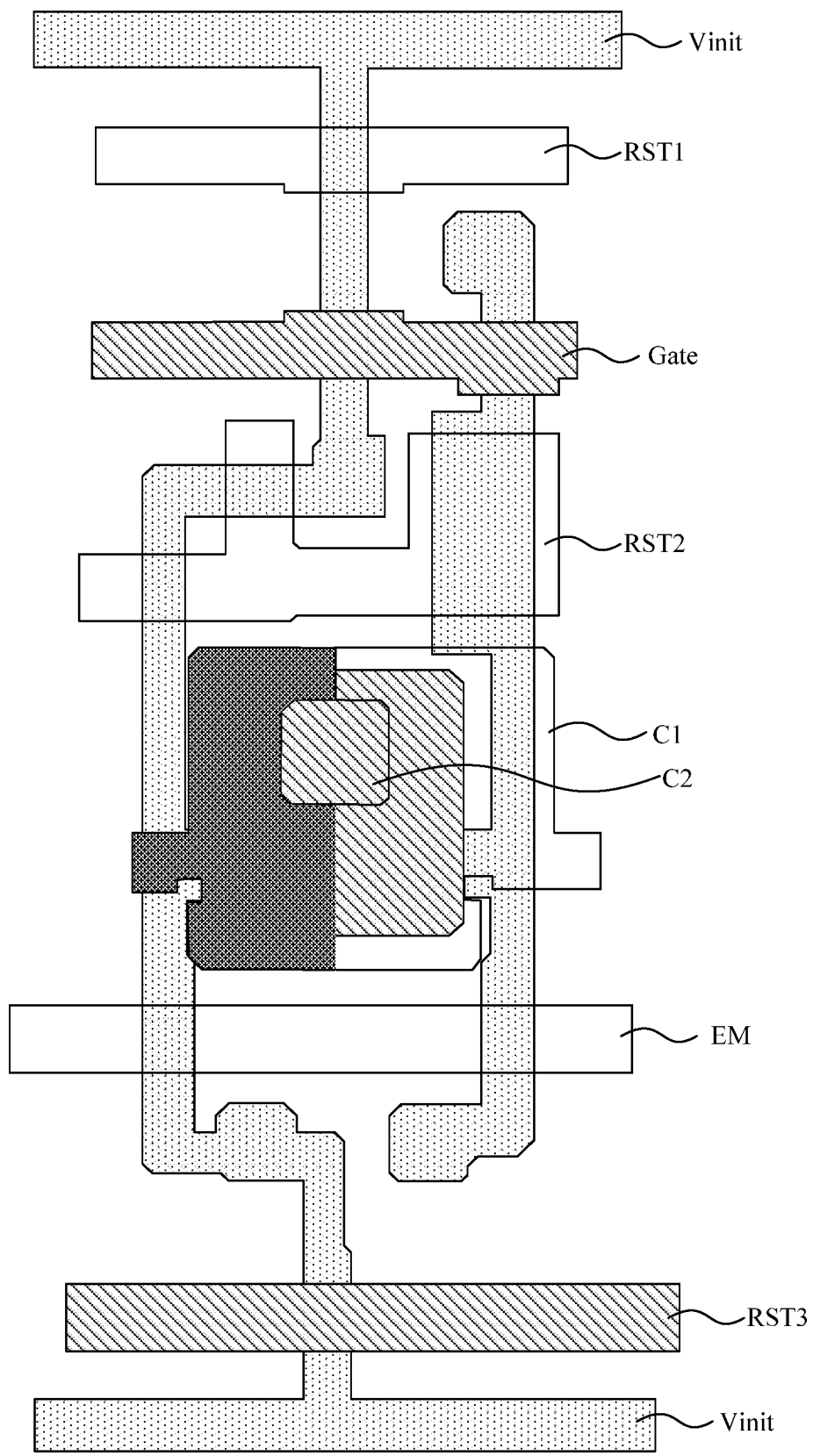
FIG. 14 is a schematic diagram of forming a second metal layer.

(3) Forming a second metal layer, which includes: depositing a second insulation thin film on the base on which the first metal layer is formed, and patterning the second insulation thin film through a patterning process to form a second insulation layer; depositing a second metal thin film on the base on which the second insulation layer is formed, and patterning the second metal thin film by a patterning process to form the second metal layer. The second metal layer includes a first plate C1, as shown in FIG. 14.

In an exemplary embodiment, an orthographic projection of the first plate C1 on the base at least partially overlaps an orthographic projection of the second plate C2 on the base. A via is arranged on the first plate C1 to expose the second plate C2.

Figure 15:
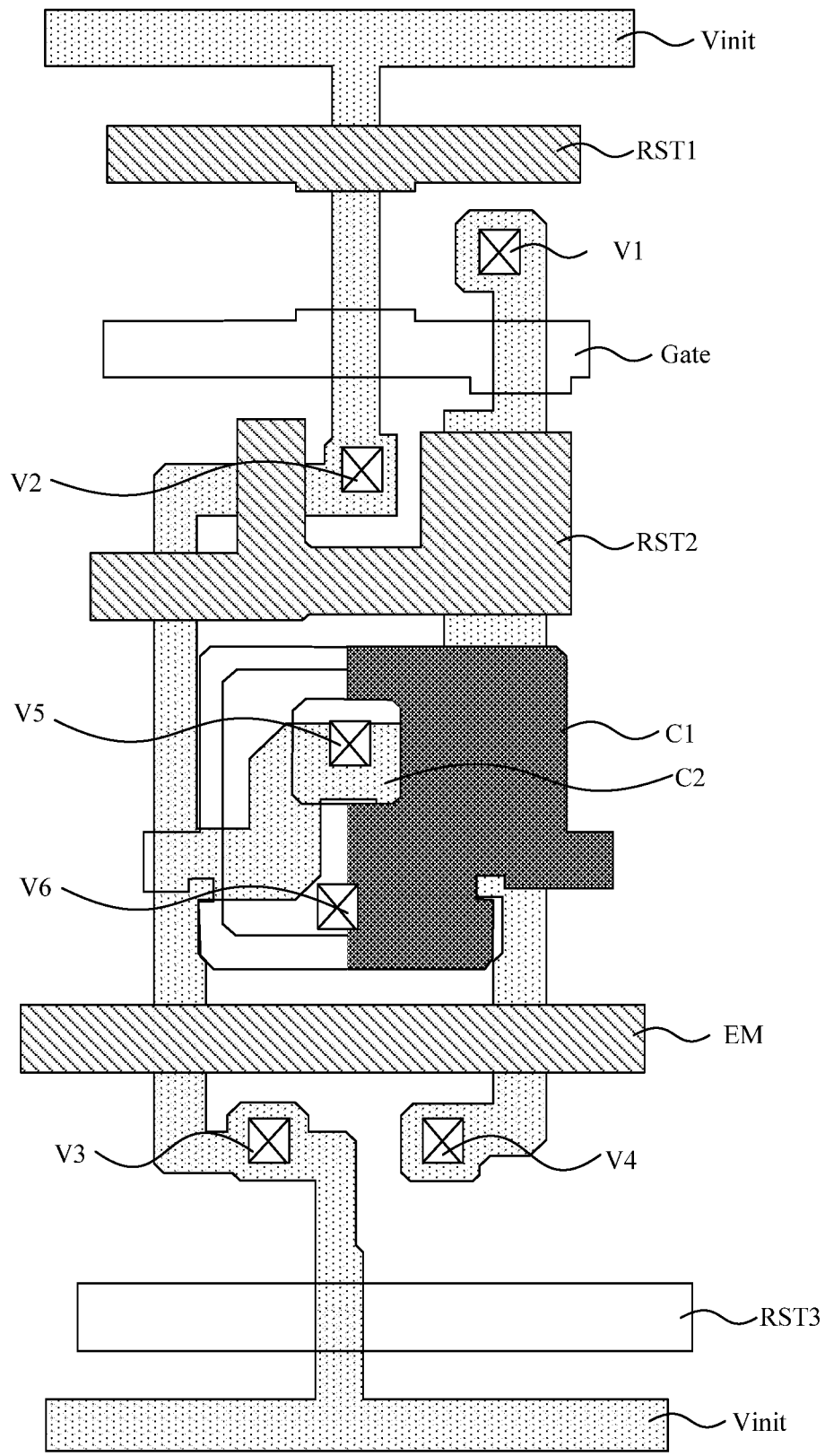
FIG. 15 is a schematic diagram of forming a third insulation layer.

(4) Forming a third insulation layer, which includes: depositing a third insulation thin film on the base on which the second metal layer is formed, and patterning the third insulation thin film through a patterning process to form a third insulation layer. The formed third insulation layer is provided with multiple vias. The multiple vias include a first via V1, a second via V2, a third via V3, and a fourth via V4 through the first insulation layer, the second insulation layer, and the third insulation layer, a fifth via V5 through the second insulation layer and the third insulation layer, and a sixth via V6 through only the third insulation layer, as shown in FIG. 15.

In an exemplary embodiment, the first via V1 exposes the active layer 31 of the third transistor. The second via V2 exposes the active layer 21 of the second transistor. The third via V3 exposes the active layer 81 of the eighth transistor. The fourth via V4 exposes the active layer 71 of the seventh transistor. The fifth via V5 exposes the second plate C2. The seventh via V7 exposes the first plate C1.

Figure 16:
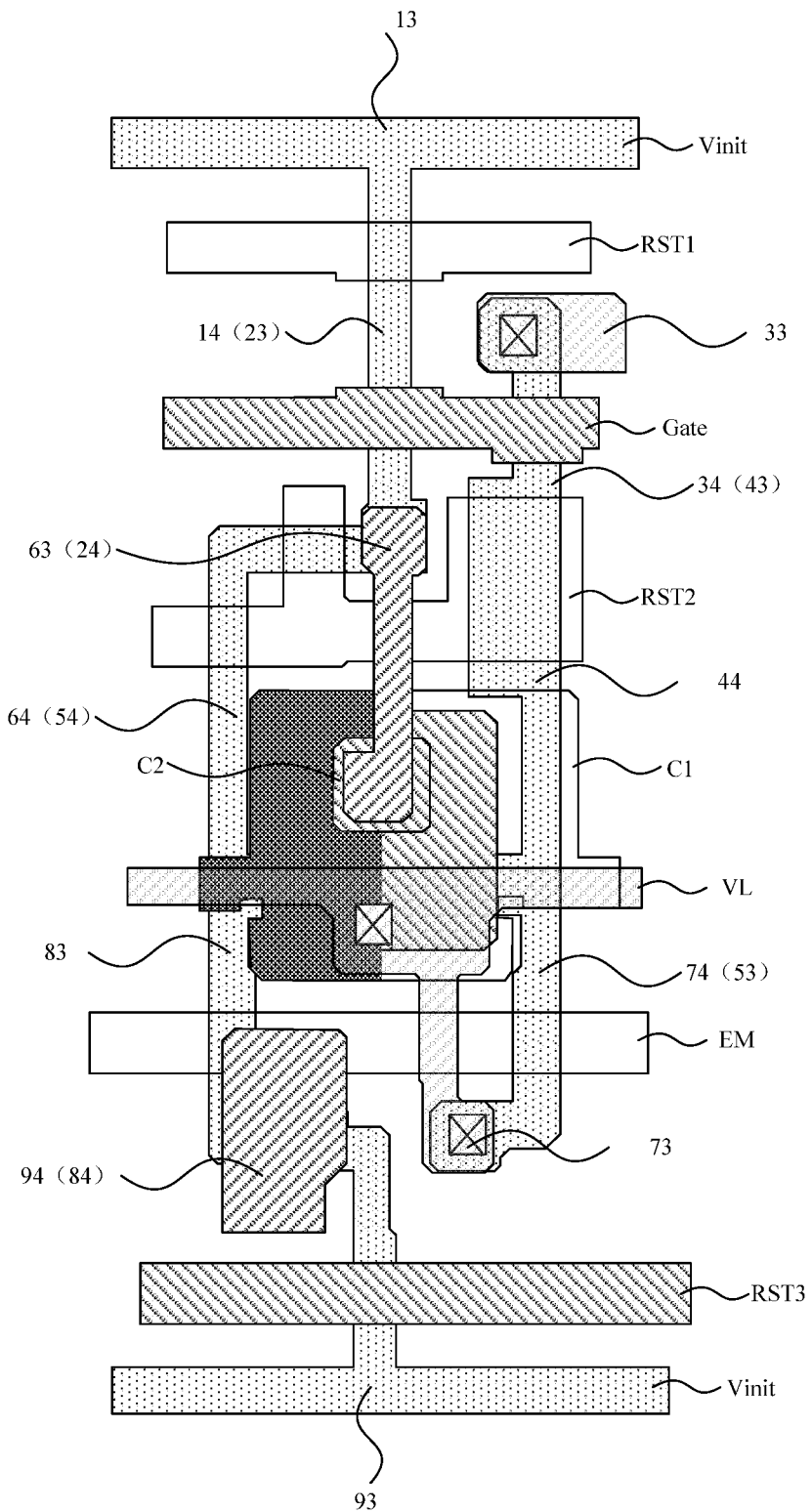
FIG. 16 is a schematic diagram of forming a third metal layer.

(5) Forming a third metal layer, which includes: depositing a third metal thin film on the base on which the third insulation layer is formed, and patterning the third metal thin film by a patterning process to form the third metal layer. The third metal layer includes a power supply connection line VL, a second electrode 24 of the second transistor, a first electrode 33 of the third transistor, a first electrode 63 of the sixth transistor, a first electrode 73 of the seventh transistor, a second electrode 84 of the eighth transistor, and a second electrode 94 of the ninth transistor, as shown in FIG. 16.

The second electrode 84 of the eighth transistor and the second electrode 94 of the ninth transistor are the same electrode, and the second electrode 24 of the second transistor and the first electrode 63 of the sixth transistor are the same electrode.

In an exemplary embodiment, the active layer is further reused as a first electrode 13 of the first transistor, a second electrode 14 of the first transistor, a first electrode 23 of the second transistor, the second electrode 34 of the third transistor, the first electrode 43 of the fourth transistor, the second electrode 44 of the fourth transistor, the first electrode 53 of the fifth transistor, the second electrode 54 of the fifth transistor, the second electrode 64 of the sixth transistor, the second electrode 74 of the seventh transistor, the first electrode 83 of the eighth transistor and the first electrode 93 of the ninth transistor.

In an exemplary embodiment, the power supply connection line VL extends in a first direction.

In an exemplary embodiment, the second electrode 14 of the first transistor and the first electrode 23 of the second transistor are the same electrode. The second electrode 34 of the third transistor and the first electrode 43 of the fourth transistor are the same electrode. The second electrode 44 of the fourth transistor, the first electrode 53 of the fifth transistor and the second electrode 74 of the seventh transistor are the same electrode. The second electrode 54 of the fifth transistor, the second electrode 64 of the sixth transistor and the first electrode 83 of the eighth transistor are the same electrode.

In an exemplary embodiment, the second electrode 14 of the first transistor is connected with the active layer 11 of the first transistor through the first via. The first electrode of the third transistor is connected with the active layer 21 of the third transistor through the second via V2. The first electrode 53 of the sixth transistor is connected with the active layer 51 of the sixth transistor through the third via V3. The second electrode 74 of the eighth transistor is connected with the active layer 71 of the eighth transistor through the fourth via V4. The first electrode 63 of the seventh transistor is connected with the active layer 61 of the seventh transistor through the fifth via V5. The first electrode 53 of the sixth transistor is connected with the second plate C2 through the sixth via V6. The power supply connection line VL is connected with the first plate C1 through the seventh via V7.

The first electrode 33 of the third transistor is connected with the active layer 31 of the third transistor through the first via V1. The second electrode 24 of the second transistor is connected with the active layer 21 of the second transistor through the second via V2. The second electrode 84 of the eighth transistor is connected with the active layer 81 of the eighth transistor through the third via V3. The first electrode 73 of the seventh transistor is connected with the active layer 71 of the seventh transistor through the fourth via V4. The second electrode 24 of the second transistor is connected with the second plate C2 through the fifth via V5. The power supply connection line VL is connected with the first plate C1 through the sixth via V6.

Figure 17:
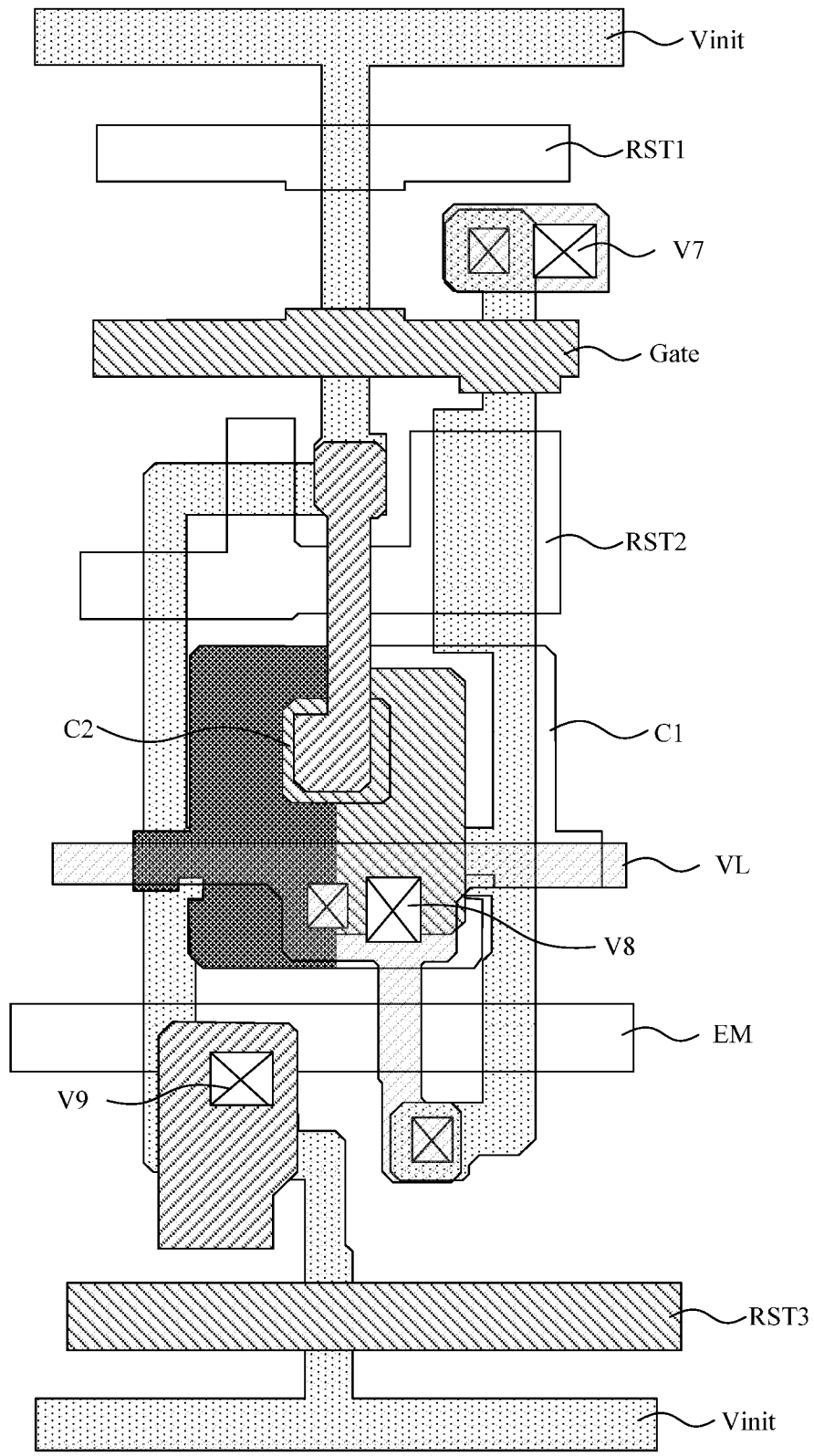
FIG. 17 is a schematic diagram of forming a first planarization layer.

(6) Forming a first planarization layer, which includes: depositing a fourth insulation thin film on the base on which the third metal layer is formed, and patterning the fourth insulation thin film through a patterning process to form a fourth insulation layer; and coating a first planarization thin film on the base on which the fourth insulation layer is formed, and forming the first planarization layer by masking, exposing, and developing the planarization thin film. The seventh via V7, the eighth via V8, and the ninth via V9 are arranged on the fourth insulation thin film and the first planarization layer, as shown in FIG. 17.

In an exemplary embodiment, the seventh via V7 exposes the first electrode 23 of the third transistor. The eighth via V8 exposes the power supply connection line VL. The ninth via V9 exposes the second electrode 84 of the eighth transistor.

Figure 18:
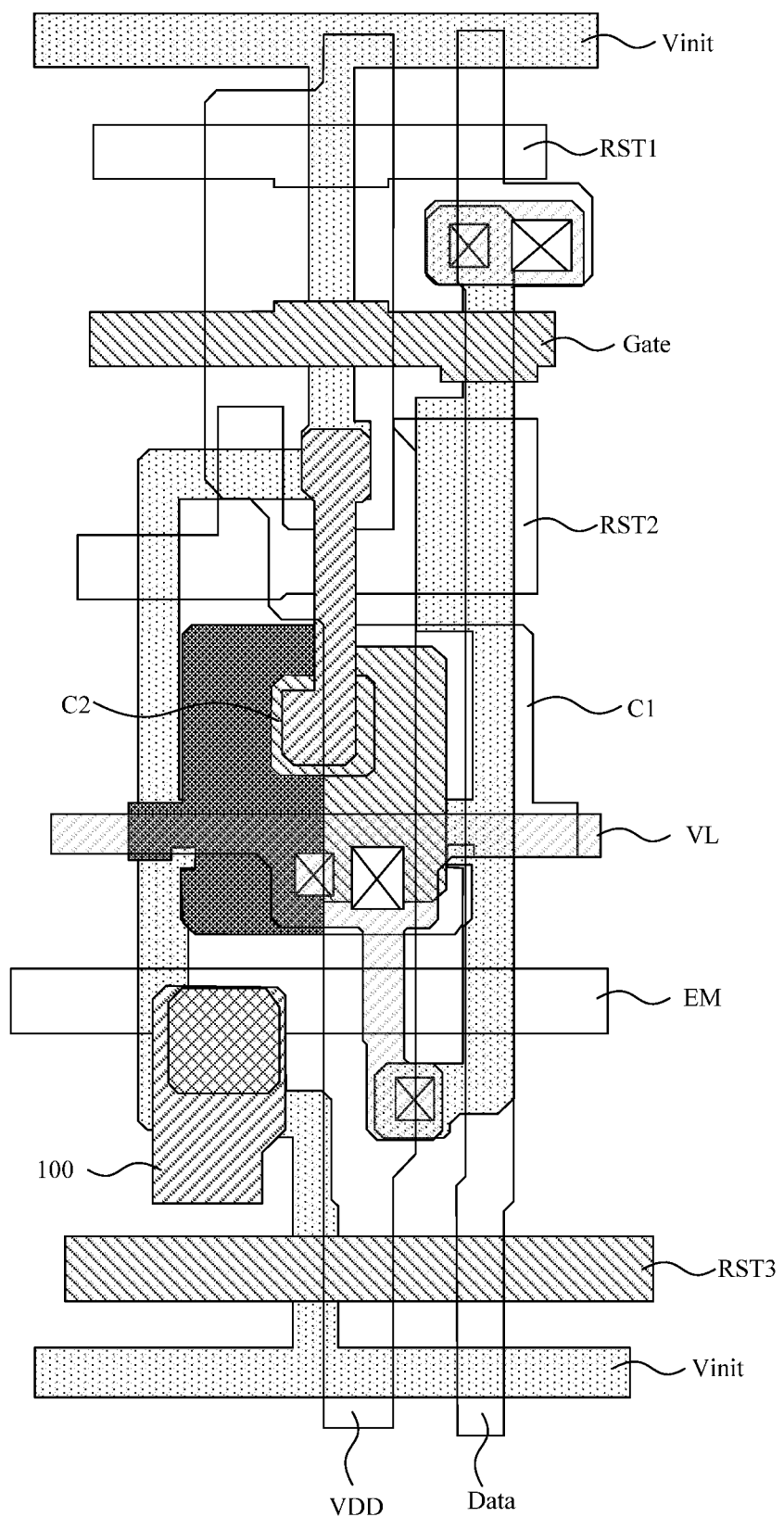
FIG. 18 is a schematic diagram of forming a fourth metal layer.

(7) Forming a fourth metal layer, which includes: depositing the fourth metal thin film on the base on which the first planarization layer is formed, patterning the fourth metal thin film by a patterning process to form a fourth metal layer. The fourth metal layer includes a first power supply line VDD, a data signal line Data and a pixel electrode 91, as shown in FIG. 18.

In an exemplary embodiment, the data signal line Data is connected with the first electrode 23 of the third transistor through the seventh via V7. The first power supply line VDD is connected with the power supply connection line VL through the eighth via V8. The connection electrode 101 is connected with the second electrode 84 of the eighth transistor through the ninth via V9.

Figure 19:
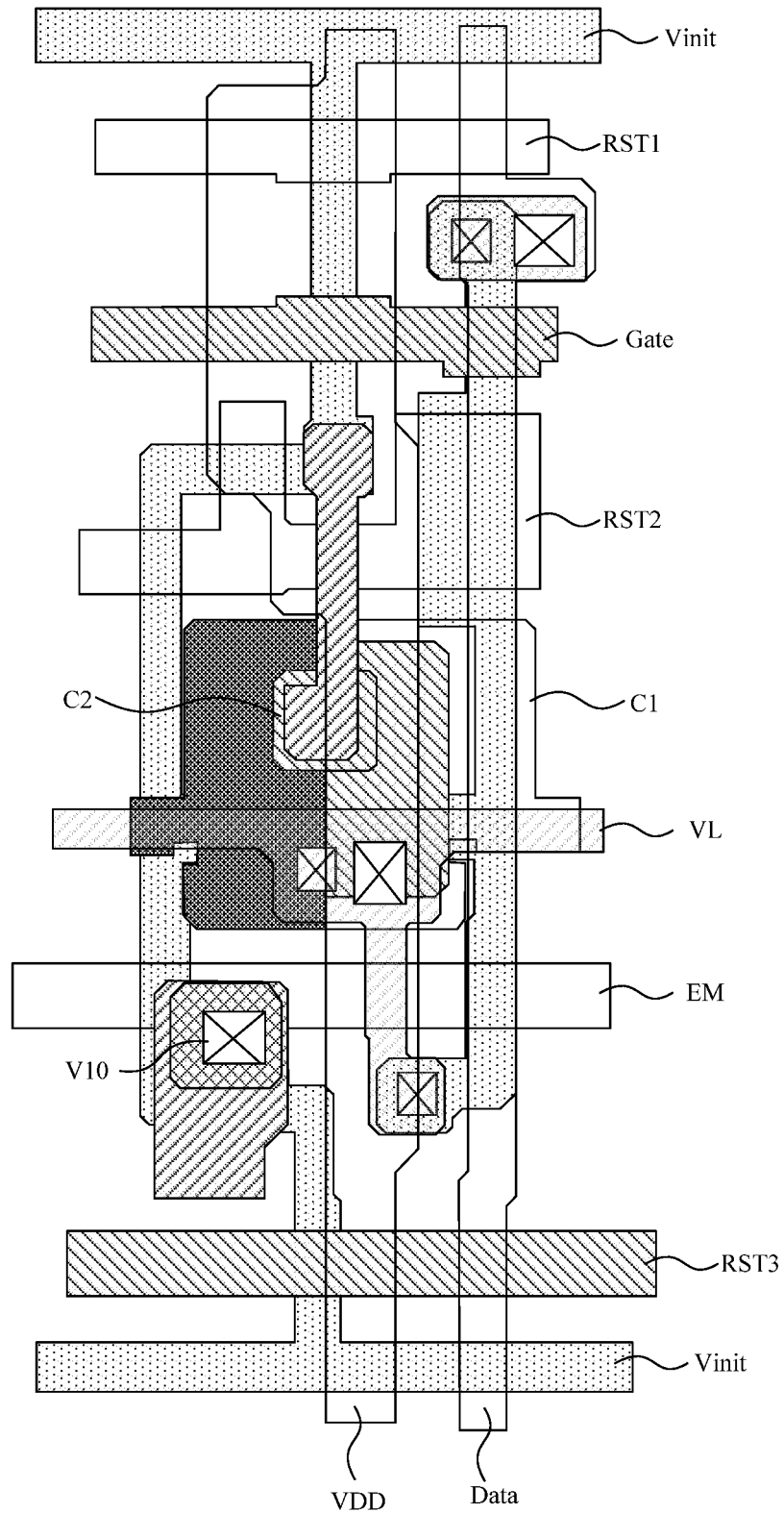
FIG. 19 is a schematic diagram of forming a second planarization layer.

(8) Forming a second planarization layer, which includes: coating a second planarization thin film on the base on which the fourth metal layer is formed, and forming the second planarization layer by masking, exposing, and developing the planarization thin film. An eleventh via V11 is arranged on the second planarization layer, as shown in FIG. 19.

In an exemplary embodiment, a tenth via V10 exposes the connection electrode 101, and the light emitting element is connected with the connection electrode 101 through the tenth via V10.

(9) Forming a transparent conductive layer, which includes: depositing a first transparent conductive thin film on the base on which the second planarization layer is formed, and patterning the first transparent conductive thin film by a patterning process to form the transparent conductive layer. The transparent conductive layer includes a first electrode formed in each of the light emitting elements and connected with the connection electrode 101 through the tenth via V10.

(10) Forming a pixel define layer, which includes: coating a pixel define thin film on the base on which the transparent conductive layer is formed, and forming a pixel define layer through mask, exposure and development processes. The pixel define layer is formed in each of the light emitting elements, and an opening region exposing the first electrode is formed in the pixel define layer in each of the light emitting elements.

(11) Forming an organic light emitting layer, which includes: forming the organic light emitting layer in the opening region of the formed pixel define layer and on the pixel define layer. The organic light emitting layer is electrically connected with the first electrode.

(12) Forming a second electrode, which includes: coating a conductive thin film on the base on which the organic light emitting layer is formed, and patterning the conductive thin film through a patterning process to form the second electrode. The second electrode covers the organic light emitting layer in each of the light emitting elements. The second electrode is electrically connected with the organic light emitting layer.

(13) Forming an encapsulation layer on the base on which the second electrode is formed. The encapsulation layer includes a first encapsulation layer made of an inorganic material, a second encapsulation layer made of an organic material, and a third encapsulation layer made of an inorganic material. The first encapsulation layer is arranged on the second electrode, the second encapsulation layer is arranged on the first encapsulation layer, and the third encapsulation layer is arranged on the second encapsulation layer to form a laminated structure of inorganic material/organic material/inorganic material.

In an exemplary embodiment, the first metal layer, the second metal layer, the third metal layer, and the fourth metal layer may be made of a metal material, such as any one or more of silver (Ag), copper (Cu), aluminum (Al) and molybdenum (Mo), or an alloy material of the above metals, such as aluminum neodymium alloy (AlNd) or molybdenum niobium alloy (MoNb), and may be a single-layer structure or a multi-layer composite structure, such as Mo/Cu/Mo.

In an exemplary embodiment, the first insulation layer, the second insulation layer, the third insulation layer and the fourth insulation layer may be made of any one or more of silicon oxide (SiOx), silicon nitride (SiNx) and silicon oxynitride (SiON), and may be a single-layer, a multi-layer or a composite layer. The first insulation layer is referred to as a first gate insulation layer, the second insulation layer is referred to as a second gate insulation layer, the third insulation layer is referred to as an interlayer insulation layer, and the fourth insulation layer is referred to as a passivation layer.

In an exemplary embodiment, the first planarization layer and the second planarization layer may adopt an organic material, and the transparent conductive thin film may adopt indium tin oxide (ITO) or indium zinc oxide (IZO).

In an exemplary embodiment, the pixel define layer may adopt polyimide, acrylic or polyethylene terephthalate.

In an exemplary embodiment, the second electrode may adopt any one or more of magnesium (Mg), silver (Ag), aluminum (Al), copper (Cu) and lithium (Li), or an alloy made of any one or more of the above metals.

In an exemplary embodiment, the active layer may be a metal oxide layer. The metal oxide layer may adopt an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, and the like. The metal oxide layer may be a single layer, or a double-layer, or a multi-layer.

An embodiment of the present disclosure further provides a method for driving a display apparatus, which is configured to drive the display apparatus. The method for driving the display apparatus provided by an embodiment of the present disclosure may include the following acts.

In Act S1, a first reset sub-circuit provides a signal of an initial signal line for a first node under control of a first reset line and a scan signal line.

In Act S2, a second reset sub-circuit provides a signal of the initial signal line for a light emitting element under control of a third reset line; and a node control sub-circuit provides a signal of a data signal line for a second node under control of the scan signal line, the second reset line and the first node, and compensates for the first node through the second node and a third node until a voltage of the first node satisfies a threshold condition.

In Act S3, a light emitting control sub-circuit provides a signal of a first power supply line for the second node and a signal of the third node for a light emitting element under control of a light emitting control line; and the node control sub-circuit provides a signal of the second node for the third node under control of the first node.

The display apparatus is the display apparatus provided by any one of the above embodiments, and its implementation principle and implementation effects are similar to those of any one of the above embodiments, and will not be repeated herein.

The accompanying drawings of the present disclosure relate only to the structures involved in the embodiments of the present disclosure, and for the other structures, reference may be made to conventional designs.

For the sake of clarity, the thickness and size of layers or microstructures are exaggerated in the drawings used to describe the embodiments of the present disclosure. It is to be understood that when an element such as a layer, film, region or base is described as being "on" or "under" another element, it can be "directly" located "on" or "under" the other element, or an intermediate element may exist.

Although the embodiments disclosed in the present disclosure are as above, the described contents are only embodiments used for convenience of understanding the present disclosure and are not intended to limit the present disclosure. Any skilled person in the art to which the present disclosure pertains can make any modifications and variations in implementation manners and details without departing from the spirit and scope disclosed in the present disclosure. However, the protection scope of the present disclosure should be subject to the scope defined by the appended claims.

The invention claimed is:

1. A display apparatus, comprising: light emitting elements arranged in a matrix; pixel circuits arranged in a matrix; a scan signal line; a data signal line; an initial signal line; a light emitting control line; a first power supply line; a first reset line; a second reset line; and a third reset line, wherein:

the pixel circuits correspond to the light emitting elements in a one to one way, each of the pixel circuits is configured to drive a corresponding light emitting element to emit light, and the pixel circuit comprises a first reset sub-circuit, a node control sub-circuit, a light emitting control sub-circuit, and a second reset sub-circuit;

the first reset sub-circuit is connected with the first reset line, the scan signal line, the initial signal line and a first node, respectively, and configured to provide a signal of the initial signal line for the first node under control of the first reset line and the scan signal line;

the node control sub-circuit is connected with the scan signal line, the second reset line, the data signal line, the first node, a second node, a third node and a first power supply line, respectively, and configured to provide a signal of the data signal line for the second node under control of the scan signal line and the second reset line, compensate for the first node through the second node and the third node until a voltage of the first node satisfies a threshold condition, and provide a signal of the second node for the third node under control of the first node;

the light emitting control sub-circuit is connected with the light emitting control line, the first power supply line, the second node, the third node and the light emitting element, respectively, and configured to provide a signal of the first power supply line for the second node and a signal of the third node for the light emitting element under control of the light emitting control line;

the second reset sub-circuit is connected with the third reset line, the initial signal line and the light emitting element, respectively, and configured to provide a signal of the initial signal line for the light emitting element under control of the third reset line; and the third reset line connected with pixel circuits located in an ith row is electrically connected with the first reset line connected with pixel circuits located in an (i+1)th row, wherein $1 \leq i < M$, and M is a total number of rows of the pixel circuits, and wherein:

each pixel circuit comprises: a storage capacitor, the storage capacitor comprises a first plate and a second plate, the first plate is connected with the first power supply line, and the second plate is connected with the first node;

an orthographic projection of the first plate on a base partially overlaps an orthographic projection of the second plate on the base, the first plate is provided with a via, and the via of the first plate exposes the second plate;

the scan signal line, the first reset line and the second reset line are located on a side of the second plate, and the light emitting control line is located on a side of the second plate away from the first reset line; and the first reset line is located on a side of the scan signal line away from the second plate, and the second reset line is located on a side of the scan signal line close to the second plate.

2. The display apparatus according to claim 1, wherein:

the display apparatus comprises: the base; a drive structure layer; and a light emitting structure layer that are sequentially arranged on the base;

the drive structure layer comprises the pixel circuit, the scan signal line, the data signal line, the initial signal line, the light emitting control line, the first power supply line, the first reset line, the second reset line and the third reset line, and the light emitting structure layer comprises the light emitting element;

the scan signal line, the initial signal line, the light emitting control line, the first reset line, the second reset line, and the third reset line extend in a first direction, and the data signal line and the first power supply line extend in a second direction; and the first direction intersects with the second direction.

3. The display apparatus according to claim 2, wherein:

the drive structure layer further comprises: a power supply connection line and a connection electrode;

the power supply connection line is arranged in a layer different from a layer in which the first power supply line is arranged, and is connected with the first power supply line, and the first plate is connected with the first power supply line through the power supply connection line;

an orthographic projection of the power supply connection line on the base at least partially overlaps an orthographic projection of the first plate on the base, and at least partially overlaps an orthographic projection of the first power supply line on the base; and the connection electrode is configured to connect the pixel circuit and the light emitting element.

4. The display apparatus according to claim 1, wherein: the third reset line is located on a side of the second plate away from the first reset line and a side of the light emitting control line away from the second plate; and the initial signal line comprises a first initial signal line and a second initial signal line, the first initial signal line and the first reset line are located on the same side of the second plate, and the first initial signal line is located on a side of the first reset line away from the second plate, the second initial signal line and the third reset line are located on the same side of the second plate, and the second initial signal line is located on a side of the third reset line away from the second plate.

5. The display apparatus according to claim 1, wherein: the node control sub-circuit comprises a write sub-circuit; a drive sub-circuit; a compensation sub-circuit; and an energy storage sub-circuit;

the write sub-circuit is connected with the scan signal line, the second reset line, the data signal line and the second node, respectively, and configured to provide a signal of the data signal line for the second node or discharge to the second node under control of the scan signal line and the second reset line;

the drive sub-circuit is connected with the first node, the second node, and the third node, respectively, and configured to provide a signal of the second node for the third node under control of the first node;

the compensation sub-circuit is connected with the first node, the second reset line and the third node, respectively, and configured to provide a potential of the third node for the first node under control of the second reset line to compensate for the first node until the voltage of the first node satisfies a threshold condition; and the energy storage sub-circuit is connected with the first power supply line and the first node, respectively, and configured to store a voltage difference between the first power supply line and the first node.

6. The display apparatus according to claim 5, wherein: the write sub-circuit comprises a third transistor and a fourth transistor;

a control electrode of the third transistor is connected with the scan signal line, a first electrode of the third transistor is connected with the data signal line, and a second electrode of the third transistor is connected with a first electrode of the fourth transistor;

a control electrode of the fourth transistor is connected with the second reset line, and a second electrode of the fourth transistor is connected with the second node; and a length of a channel region of the fourth transistor is greater than a threshold length, and a width of the channel region of the fourth transistor is greater than a threshold width.

7. The display apparatus according to claim 5, wherein: the drive sub-circuit comprises: a fifth transistor, and the fifth transistor is a drive transistor, and the energy storage sub-circuit comprises: a storage capacitor;

a control electrode of the fifth transistor is connected with the first node, a first electrode of the fifth transistor is connected with the second node, and a second electrode of the fifth transistor is connected with the third node; and a first end of the storage capacitor is connected with the first power supply line, and a second end of the storage capacitor is connected with the first node.

8. The display apparatus according to claim 7, wherein the threshold condition is that a voltage of the first node is equal to a difference between a voltage of the signal of the data signal line and an absolute value of a threshold voltage of the fifth transistor.

9. The display apparatus according to claim 5, wherein: the compensation sub-circuit comprises: a sixth transistor; and a control electrode of the sixth transistor is connected with the second reset line, a first electrode of the sixth transistor is connected with the first node, and a second electrode of the sixth transistor is connected with the third node.

10. The display apparatus according to claim 1, wherein: the first reset sub-circuit comprises a first transistor and a second transistor;

a control electrode of the first transistor is connected with the first reset line, a first electrode of the first transistor is connected with the initial signal line, and a second electrode of the first transistor is connected with a first electrode of the second transistor; and a control electrode of the second transistor is connected with the scan signal line, and a second electrode of the second transistor is connected with the first node.

11. The display apparatus according to claim 1, wherein: the light emitting control sub-circuit comprises a seventh transistor and an eighth transistor;

a control electrode of the seventh transistor is connected with the light emitting control line, a first electrode of the seventh transistor is connected with the first power supply line, and a second electrode of the seventh transistor is connected with the second node; and a control electrode of the eighth transistor is connected with the light emitting control line, a first electrode of the eighth transistor is connected with the third node, and a second electrode of the eighth transistor is connected with the light emitting element.

12. The display apparatus according to claim 1, wherein: the second reset sub-circuit comprises a ninth transistor; and a control electrode of the ninth transistor is connected with the third reset line, a first electrode of the ninth transistor is connected with the initial signal line, and a second electrode of the ninth transistor is connected with the light emitting element.

13. The display apparatus according to claim 1, wherein: the first reset sub-circuit comprises: a first transistor; and a second transistor; the node control sub-circuit comprises a third transistor, a fourth transistor, a fifth transistor, a sixth transistor and a storage capacitor, and the fifth transistor is a drive transistor, the light emitting control sub-circuit comprises a seventh transistor and an eighth transistor, and the second reset sub-circuit comprises a ninth transistor;

a control electrode of the first transistor is connected with the first reset line, a first electrode of the first transistor is connected with the initial signal line, and a second electrode of the first transistor is connected with a first electrode of the second transistor;

a control electrode of the second transistor is connected with the scan signal line, and a second electrode of the second transistor is connected with the first node;

a control electrode of the third transistor is connected with the scan signal line, a first electrode of the third transistor is connected with the data signal line, and a second electrode of the third transistor is connected with the a first electrode of the fourth transistor;

a control electrode of the fourth transistor is connected with the second reset line, and a second electrode of the fourth transistor is connected with the second node;

a control electrode of the fifth transistor is connected with the first node, a first electrode of the fifth transistor is connected with the second node, and a second electrode of the fifth transistor is connected with the third node;

a control electrode of the sixth transistor is connected with the second reset line, a first electrode of the sixth transistor is connected with the first node, and a second electrode of the sixth transistor is connected with the third node;

a first end of the storage capacitor is connected with the first power supply line, and a second end of the storage capacitor is connected with the first node;

a control electrode of the seventh transistor is connected with the light emitting control line, a first electrode of the seventh transistor is connected with the first power supply line, and a second electrode of the seventh transistor is connected with the second node;

a control electrode of the eighth transistor is connected with the light emitting control line, a first electrode of the eighth transistor is connected with the third node, and a second electrode of the eighth transistor is connected with the light emitting element; and a control electrode of the ninth transistor is connected with the third reset line, a first electrode of the ninth transistor is connected with the initial signal line, and a second electrode of the ninth transistor is connected with the light emitting element.

14. The display apparatus according to claim 13, wherein:
each transistor of the first transistor to the ninth transistor comprises: an active layer, a control electrode, a first electrode, and a second electrode;

a drive structure layer comprises: an active layer, a first insulation layer, a first metal layer, a second insulation layer, a second metal layer, a third insulation layer, a third metal layer, a fourth insulation layer, a first planarization layer, a fourth metal layer, and a second planarization layer that are sequentially arranged in a direction perpendicular to the base; and the active layer comprises the initial signal line and active layers of all transistors, the first metal layer comprises the scan signal line, the first reset line, the second reset line, the second plate, the light emitting control line, the third reset line and control electrodes of all transistors, the second metal layer comprises: the first plate; the third metal layer comprises the power supply connection line and first electrodes or second electrodes of a part of the transistors, and the fourth metal layer comprises the first power supply line, the data signal line and the pixel electrode.

15. The display apparatus according to claim 14, wherein:
the control electrode of the first transistor, the control electrode of the second transistor, the control electrode of the third transistor, the control electrode of the fourth transistor and the control electrode of the sixth transistor are located on a first side of the second plate, the control electrode of the seventh transistor, the control electrode of the eighth transistor and the control electrode of the ninth transistor are located on a second side of the second plate, and the first side and the second side are arranged oppositely to each other; and the control electrode of the second transistor is located on a side of the control electrode of the first transistor close to the second plate, the control electrode of the second transistor and the control electrode of the third transistor are an integrated structure, the control electrode of the fourth transistor is located on a side of the control electrode of the second transistor close to the second plate, the control electrode of the fourth transistor and the control electrode of the sixth transistor are an integrated structure, the second plate and the control electrode of the fifth transistor are an integrated structure, the control electrode of the seventh transistor and the control electrode of the eighth transistor are an integrated structure, and the control electrode of the ninth transistor is located on a side of the control electrode of the seventh transistor away from the second plate.

16. The display apparatus according to claim 14, wherein:
the first insulation layer, the second insulation layer, and the third insulation layer are provided with a first via, a second via, a third via, and a fourth via, the second insulation layer and the third insulation layer are provided with a fifth via, the third insulation layer is provided with a sixth via, the fourth insulation layer and the first planarization layer are provided with a seventh via, an eighth via and a ninth via, and the second planarization layer comprises a tenth via; and the first via exposes the active layer of the third transistor, and the first electrode of the third transistor is connected with the active layer of the third transistor through the first via, the second via exposes the active layer of the second transistor, and the second electrode of the second transistor is connected with the active layer of the second transistor through the second via; the third via exposes the active layer of the eighth transistor, and the second electrode of the eighth transistor is connected with the active layer of the eighth transistor through the third via, the fourth via exposes the active layer of the seventh transistor, and the first electrode of the seventh transistor is connected with the active layer of the seventh transistor through the fourth via; the fifth via exposes the second plate, and the second electrode of the second transistor is connected with the second plate through the fifth via, the sixth via exposes the first plate, and the power supply connection line is connected with the first plate through the sixth via, the seventh via exposes the first electrode of the third transistor, and the data signal line is connected with the first electrode of the third transistor through the seventh via, the eighth via exposes the power supply connection line, and the first power supply line is connected with the power supply connection line through the eighth via, the ninth via exposes the second electrode of the eighth transistor, and the connection electrode is connected with the second electrode of the eighth transistor through the ninth via, the tenth via exposes the connection electrode, and the light emitting element is connected with the connection electrode through the tenth via.

17. The display apparatus according to claim 1, wherein:
the light emitting element comprises: an organic light emitting diode; and
an anode of the organic light emitting diode is connected with a second electrode of an eighth transistor and a second electrode of a ninth transistor, respectively, and a cathode of the organic light emitting diode is connected with a second power supply line.

18. The display apparatus according to claim 1, wherein:
the light emitting element comprises: a first electrode; a second electrode; and an organic light emitting layer; the first electrode is located on a side of the organic light emitting layer close to the base, and the second electrode is located on a side of the organic light emitting layer away from the base; and
a light emitting structure layer comprises a pixel define layer, a transparent conductive layer, an organic material layer and a conductive layer, the transparent conductive layer comprises a first electrode, the organic material layer comprises an organic light emitting layer, and the conductive layer comprises a second electrode.

19. A method for driving a display apparatus according to claim 1, the method comprising:
providing, by the first reset sub-circuit, the signal of the initial signal line for the first node under control of the first reset line and the scan signal line;
providing, by the second reset sub-circuit, the signal of the initial signal line for the light emitting element under control of the third reset line, providing, by the node control sub-circuit, the signal of the data signal line for the second node under control of the scan signal line, the second reset line and the first node, and compensating for the first node through the second node and the third node until the voltage of the first node satisfies the threshold condition; and
providing, by the light emitting control sub-circuit, the signal of the first power supply line for the second node and the signal of the third node for the light emitting element under control of the light emitting control line, and providing, by the node control sub-circuit, the signal of the second node for the third node under control of the first node.

20. A display apparatus, comprising: light emitting elements arranged in a matrix; pixel circuits arranged in a matrix; a scan signal line; a data signal line; an initial signal line; a light emitting control line; a first power supply line; a first reset line; and a second reset line; wherein:
each of the pixel circuits is configured to drive a corresponding light emitting element to emit light, and the pixel circuit comprises a first reset sub-circuit, a node control sub-circuit, and a light emitting control sub-circuit;
the first reset sub-circuit is connected with the first reset line, the scan signal line, the initial signal line and a first node, and configured to provide a signal of the initial signal line for the first node under control of the first reset line and the scan signal line;
the node control sub-circuit is connected with the scan signal line, the second reset line, the data signal line, the first node, a second node, a third node and a first power supply line, and configured to provide a signal of the data signal line for the second node under control of the scan signal line and the second reset line, compensate for the first node through the second node and the third node until a voltage of the first node satisfies a threshold condition; and
the light emitting control sub-circuit is connected with the light emitting control line, the first power supply line, the node control sub-circuit and the light emitting element, and used for providing a signal transmitted through the node control sub-circuit for the light emitting element, and wherein:
each pixel circuit comprises: a storage capacitor, the storage capacitor comprises a first plate and a second plate, the first plate is connected with the first power supply line, and the second plate is connected with the first node;
an orthographic projection of the first plate on a base partially overlaps an orthographic projection of the second plate on the base, the first plate is provided with a via, and the via of the first plate exposes the second plate;
the scan signal line, the first reset line and the second reset line are located on a side of the second plate, and the light emitting control line is located on a side of the second plate away from the first reset line; and
the first reset line is located on a side of the scan signal line away from the second plate, and the second reset line is located on a side of the scan signal line close to the second plate.

21. The display apparatus according to claim 20, further comprising: a third reset line; and a second reset sub-circuit; wherein the second reset sub-circuit is connected with the third reset line, the initial signal line and the light emitting element, and configured to provide a signal of the initial signal line for the light emitting element under control of the third reset line; wherein:
the third reset line is located on a side of the second plate away from the first reset line and a side of the light emitting control line away from the second plate; and
the initial signal line comprises a first initial signal line and a second initial signal line, the first initial signal line and the first reset line are located on the same side of the second plate, and the first initial signal line is located on a side of the first reset line away from the second plate, the second initial signal line and the third reset line are located on the same side of the second plate, and the second initial signal line is located on a side of the third reset line away from the second plate.

22. The display apparatus according to claim 20, wherein a scan signal is inputted from the scan signal line and a second reset signal is inputted form the second reset line, and the scan signal rises from a low level to a high level earlier than the second reset signal.

* * * * *